(12) United States Patent
Kim et al.

(10) Patent No.: US 12,713,694 B2
(45) Date of Patent: Aug. 18, 2026

(54) SEMICONDUCTOR DEVICE HAVING MERGED EPITAXIAL PATTERN AND METHOD FOR FABRICATING THE SAME

(71) Applicant: SAMSUNG ELECTRONICS CO., LTD., Suwon-si (KR)

(72) Inventors: Kyung ho Kim, Suwon-si (KR); Myung Il Kang, Suwon-si (KR); Sung Uk Jang, Suwon-si (KR); Kyung Hee Cho, Suwon-si (KR); Do Young Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 393 days.

(21) Appl. No.: 18/314,484

(22) Filed: May 9, 2023

(65) Prior Publication Data

US 2024/0145474 A1 May 2, 2024

(30) Foreign Application Priority Data

Nov. 2, 2022 (KR) ........................ 10-2022-0144302

(51) Int. Cl.
*H10D 84/00* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 84/851; H10D 84/85; H10D 84/83; H10D 30/6735; H10D 62/121
See application file for complete search history.

(56) References Cited

U.S. PATENT DOCUMENTS 10,192,819 B1 1/2019 Chanemougame et al.
10,256,158 B1 4/2019 Frougier et al.
(Continued)

OTHER PUBLICATIONS

Office Action dated Nov. 24, 2025 issued in the corresponding Korean Patent Application No. 10-2022-0144302.

*Primary Examiner* — Reema Patel
(74) *Attorney, Agent, or Firm* — MORGAN, LEWIS & BOCKIUS LLP

(57) ABSTRACT

A semiconductor device includes a substrate, a first active pattern disposed on the substrate, a second active pattern stacked on the first active pattern, a first gate structure extending to intersect the first active pattern and the second active pattern, a second gate structure spaced apart from the first gate structure and extending to intersect the first active pattern and the second active pattern, a first epitaxial pattern interposed between the first gate structure and the second gate structure, and connected to the first active pattern, a second epitaxial pattern interposed between the first gate structure and the second gate structure, and connected to the second active pattern, an insulating pattern interposed between the first epitaxial pattern and the second epitaxial pattern, and a semiconductor film interposed between the insulating pattern and the second epitaxial pattern, the semiconductor film extending along a top surface of the insulating pattern.

20 Claims, 32 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |

(52) U.S. Cl.

CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/0188* (2025.01); *H10D 84/038* (2025.01); *H10D 88/01* (2025.01)

(56) References Cited

U.S. PATENT DOCUMENTS

| | | | | |
|---|---|---|---|---|
| 10,734,384 | B1 | 8/2020 | Li et al. | |
| 11,121,044 | B2 | 9/2021 | Cheng et al. | |
| 2002/0164841 | A1 | 11/2002 | Assaderaghi et al. | |
| 2016/0308048 | A1* | 10/2016 | Ching | H10D 30/0245 |
| 2019/0319095 | A1 | 10/2019 | Zhang et al. | |
| 2020/0294969 | A1 | 9/2020 | Rachmady et al. | |
| 2020/0303509 | A1* | 9/2020 | Mehandru | H10D 30/62 |
| 2021/0184000 | A1 | 6/2021 | Ramaswamy et al. | |
| 2021/0202497 | A1 | 7/2021 | Lin et al. | |
| 2021/0366782 | A1 | 11/2021 | Xie et al. | |
| 2023/0068065 | A1* | 3/2023 | Khaderbad | H10D 30/014 |

* cited by examiner

SEMICONDUCTOR DEVICE HAVING MERGED EPITAXIAL PATTERN AND METHOD FOR FABRICATING THE SAME

CROSS-REFERENCE TO RELATED APPLICATION

This application claims priority under 35 U.S.C. § 119 to Korean Patent Application No. 10-2022-0144302, filed on Nov. 2, 2022, in the Korean Intellectual Property Office, the contents of which are herein incorporated by reference in their entirety.

TECHNICAL FIELD

The present disclosure relates to a semiconductor device and a method for manufacturing the same, and more particularly, relates to a semiconductor device including stacked multi-gate transistors and a method for manufacturing the same.

DISCUSSION OF RELATED ART

For increasing an integration density of a semiconductor device, a multi-gate transistor in which a fin-shaped or nanowire-shaped silicon body is formed on a substrate and a gate is formed on a surface of the silicon body may be used. In addition, the semiconductor device may include a lower multi-gate transistor on a substrate, and an upper multi-gate transistor stacked on the lower multi-gate transistor.

Such a multi-gate transistor uses a three-dimensional channel surrounded by several gates on multiple surfaces for easy scaling. Further, current control capability of the multi-gate transistor may be enhanced without increasing a gate length of the multi-gate transistor. For example, the multi-gate transistor may provide better electrical control over the channel, therefore allowing more effective suppression of off-state leakage current. In addition, the multi-gate transistor may effectively suppress SCE (short channel effect) in which potential of a channel area is affected by drain voltage.

SUMMARY

An embodiment of the present disclosure provides a semiconductor device in which formation of an unmerged epitaxial pattern is prevented.

An embodiment of the present disclosure provides a method for manufacturing a semiconductor device in which formation of an unmerged epitaxial pattern is prevented.

According to an embodiment of the present disclosure, there is provided a semiconductor device including a substrate, a first active pattern disposed on the substrate and extending in a first direction, a second active pattern stacked on the first active pattern and extending in the first direction, a first gate structure extending in a second direction to intersect the first active pattern and the second active pattern, the second direction intersecting the first direction, a second gate structure spaced apart from the first gate structure in the first direction and extending in the second direction to intersect the first active pattern and the second active pattern, a first epitaxial pattern interposed between the first gate structure and the second gate structure, the first epitaxial pattern connected to the first active pattern, a second epitaxial pattern interposed between the first gate structure and the second gate structure, the second epitaxial pattern connected to the second active pattern, an insulating pattern interposed between the first epitaxial pattern and the second epitaxial pattern, and a semiconductor film interposed between the insulating pattern and the second epitaxial pattern, the semiconductor film extending along a top surface of the insulating pattern.

According to an embodiment of the present disclosure, there is provided a semiconductor device including a substrate, a first active pattern disposed on the substrate and extending in a first direction, a second active pattern stacked on the first active pattern and extending in the first direction, a gate structure disposed on the substrate and extending in a second direction intersecting the first direction, each of the first active pattern and the second active pattern passing through the gate structure, a first epitaxial pattern disposed on a side surface of the gate structure, and connected to the first active pattern, a second epitaxial pattern disposed on the side surface of the gate structure and connected to the second active pattern, an insulating pattern interposed between the first epitaxial pattern and the second epitaxial pattern, and a semiconductor film interposed between the insulating pattern and the second epitaxial pattern, in which the second epitaxial pattern includes an epitaxial layer grown using the second active pattern and the semiconductor film as seed layers.

According to an embodiment of the present disclosure, there is provided a semiconductor device including a substrate, a plurality of lower sheet patterns sequentially stacked on the substrate, and spaced apart from each other, in which each of the plurality of lower sheet patterns extends in a first direction, a plurality of upper sheet patterns sequentially stacked on the plurality of lower sheet patterns, and spaced apart from each other, in which each of the plurality of upper sheet patterns extends in the first direction, an isolation pattern interposed between the plurality of lower sheet patterns and the plurality of upper sheet patterns, a gate structure disposed on the substrate and extending in a second direction intersecting the first direction, in which each of the plurality of lower sheet patterns and each of the plurality of upper sheet patterns pass through the gate structure, a first epitaxial pattern disposed on a side surface of the gate structure, and connected to the plurality of lower sheet patterns, in which the first epitaxial pattern has a first conductivity type, a second epitaxial pattern disposed on the side surface of the gate structure, and connected to the plurality of upper sheet patterns, in which the second epitaxial pattern has a second conductivity type different from the first conductivity type, an insulating pattern disposed on a side surface of the isolation pattern and interposed between the first epitaxial pattern and the second epitaxial pattern, and a polysilicon film disposed between the insulating pattern and the second epitaxial pattern and extending along a top surface of the insulating pattern.

BRIEF DESCRIPTION OF THE DRAWINGS

The above and other aspects and features of the present disclosure will become more apparent by describing in detail illustrative embodiments thereof with reference to the accompanying drawings, in which.

Figure 1:
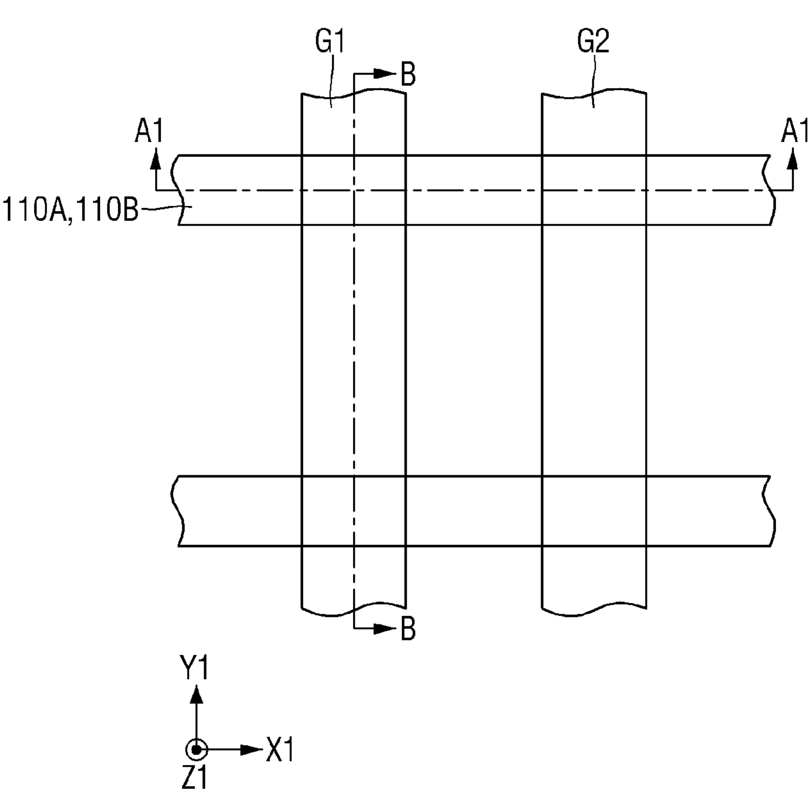
FIG. 1 is a schematic layout diagram for illustrating a semiconductor device according to an embodiment of the present disclosure.

Since the drawings in FIGS. 1-32 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. For example, throughout the disclosure, the expression "at least one of a, b or c" indicates only a, only b, only c, both a and b, both a and c, both b and c, all of a, b, and c, or variations thereof. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is disposed "directly on" or "directly on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is disposed "directly below" or "directly under" another layer, film, region, plate, or the like, the former directly contacts the latter and still another layer, film, region, plate, or the like is not disposed between the former and the latter.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent to" or "directly before" is indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath", "below", "lower", "under", "above", "upper", and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction X1", "second direction Y1" and "third direction Z1" should not be interpreted only to have a geometric relationship in which the first direction, the second direction, and the third direction are perpendicular to each other. The "first direction X1", "second direction Y1" and "third direction Z1" may be interpreted to have a broader direction within a range in which components herein may work functionally.

Hereinafter, referring to FIG. 1 to FIG. 13, a semiconductor device according to embodiments of the present disclosure is described.

Figure 2:
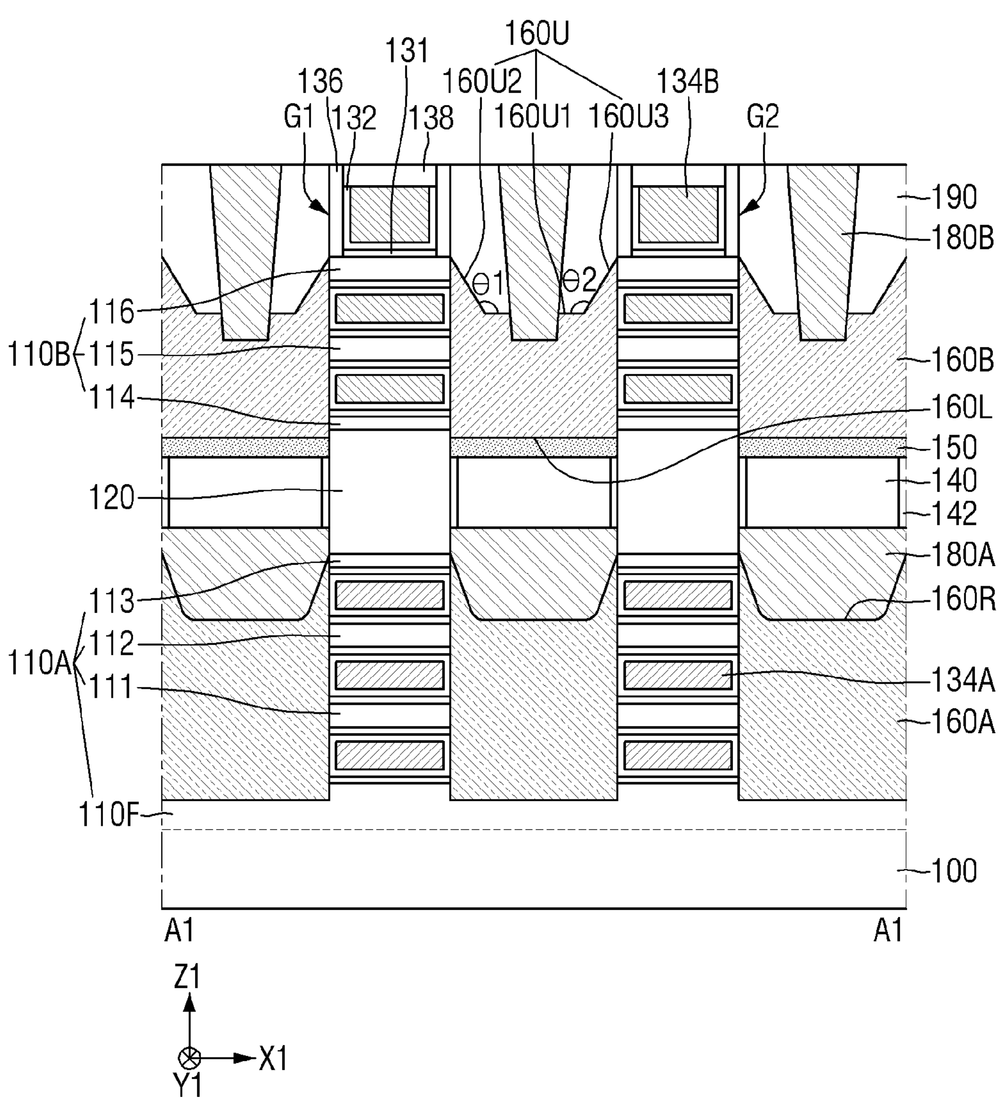
FIG. 2 is a cross-sectional view taken along A1-A1 of FIG. 1.
Figure 3:
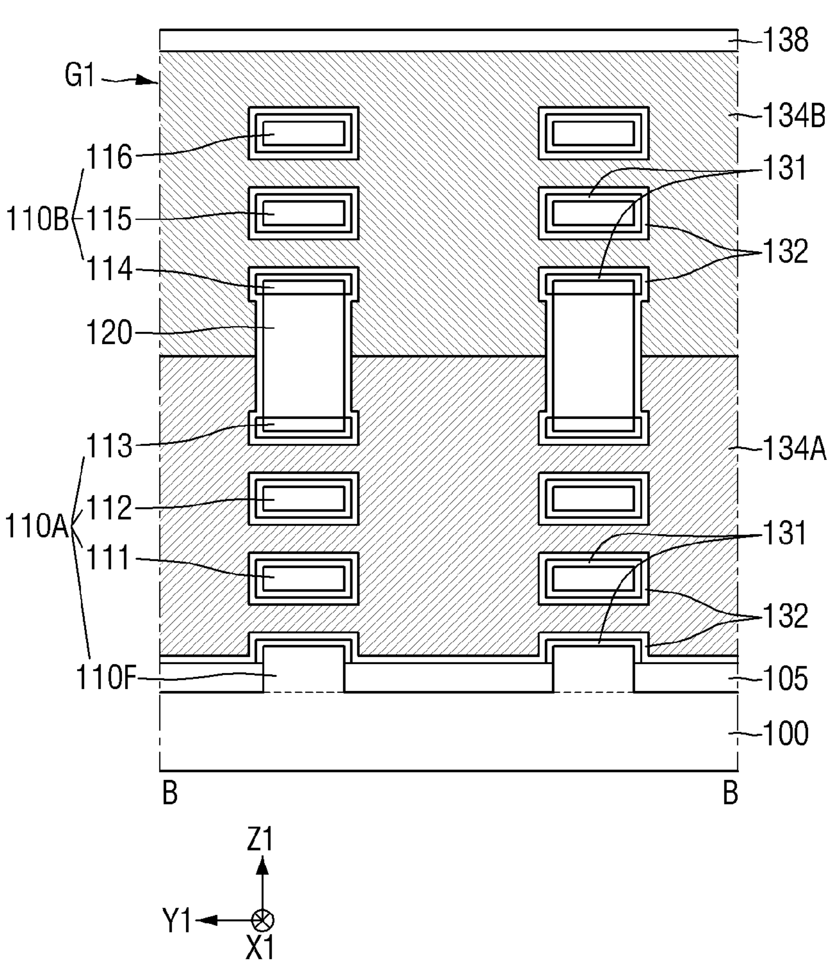
FIG. 3 is a cross-sectional view taken along B-B of FIG. 1.

FIG. 1 is a schematic layout diagram for illustrating a semiconductor device according to an embodiment of the present disclosure. FIG. 2 is a cross-sectional view taken along A1-A1 of FIG. 1. FIG. 3 is a cross-sectional view taken along B-B of FIG. 1.

Referring to FIG. 1 to FIG. 3, the semiconductor device according to an embodiment of the present disclosure may include a substrate 100, a first active pattern 110A, a second active pattern 110B, a field insulating film 105, an isolation pattern 120, a first gate structure G1, a second gate structure G2, a first epitaxial pattern 160A, a second epitaxial pattern 160B, an insulating pattern 140, a liner film 142, a semiconductor film 150, an interlayer insulating film 190, a first source/drain contact 180A, and a second source/drain contact 180B.

The substrate 100 may be made of bulk silicon (Si) or SOI (silicon-on-insulator). Alternatively, the substrate 100 may be embodied as a silicon (Si) substrate, or may be made of a material other than silicon (Si), such as, for example, silicon germanium (SiGe), SGOI (silicon germanium on insulator), indium antimonide (InSb), lead telluride (PbTe), indium arsenide (InAs), indium phosphide (InP), gallium phosphide (GaP), gallium arsenide (GaAs) gallium antimonide (GaSb), or indium gallium arsenide (InGaAs), but the present disclosure is not limited thereto. Alternatively, the substrate 100 may be composed of a base substrate and an epitaxial layer formed on the base substrate. The substrate 100 may include a conductive area, for example, a well doped with impurities or a structure doped with impurities. In addition, the substrate 100 may include one or more semiconductor layers or structures and may include active or operable portions of semiconductor devices. For convenience of description, an example in which the substrate 100 is embodied as the silicon (Si) substrate is described below.

The first active pattern 110A and the second active pattern 110B may be sequentially disposed on the substrate 100. The first active pattern 110A may be directly disposed on the substrate 100. The second active pattern 110B may be spaced apart from the first active pattern 110A and may be disposed on the first active pattern 110A. That is, the second active pattern 110B may be further away from the substrate 100 than the first active pattern 110A may be. Each of the first active pattern 110A and the second active pattern 110B may extend in the first direction X1 parallel to the top surface of the substrate 100 (see FIGS. 1 and 2). Further, the first active pattern 110A and the second active pattern 110B may overlap each other in a direction that intersects the top surface of substrate 100, that is, in the third direction Z1.

Each of the first active pattern 110A and the second active pattern 110B may include silicon (Si) or germanium (Ge) as an elemental semiconductor material. Alternatively, each of the first active pattern 110A and the second active pattern 110B may include a compound semiconductor, for example, a group IV-IV compound semiconductor or a group III-V compound semiconductor. The group IV-IV compound semiconductor may include, for example, a binary compound including two of carbon (C), silicon (Si), germanium (Ge), and tin (Sn), a ternary compound including three thereof, or a compound obtained by doping a group IV element thereto. In an embodiment of the present disclosure, each of the first active pattern 110A and the second active pattern 110B may include, for example, silicon carbide (SiC), silicon-germanium (SiGe), silicon germanium carbide (SiGeC). The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other. In an embodiment of the present disclosure, each of the first active pattern 110A and the second active pattern 110B may include, for example, gallium arsenide (GaAs), gallium antimonide (GaSb), gallium phosphide (GaP), indium arsenide (InAs), indium phosphide (InP), indium antimonide (InSb), or indium gallium arsenide (InGaAs), or the like. For convenience of description, an example in which each of the first active pattern 110A and the second active pattern 110B is embodied as a silicon (Si) pattern is described.

In an embodiment of the present disclosure, the first active pattern 110A may include a plurality of lower sheet patterns (e.g., first to third sheet patterns 111 to 113) spaced apart from the substrate 100. The first to third sheet patterns 111 to 113 may be sequentially stacked and disposed on the substrate 100 and spaced apart from each other and may extend in the first direction X1. The lower sheet patterns may be used as channel areas of multi-bridge channel field effect transistor (MBCFET®) including a multi-bridge channel. The number of the lower sheet patterns is only an example, and the present disclosure is not limited thereto. A semiconductor device according to an embodiment of the present disclosure may be a three-dimensional (3D) transistor. For example, the three-dimensional (3D) transistor may be a multi-gate transistor uses a three-dimensional (3D) channel such as, for example, a gate-all-around field-effect transistor (GAAFET).

In an embodiment of the present disclosure, the first active pattern 110A may further include a fin pattern 110F. The fin pattern 110F may be formed between the substrate 100 and the first sheet pattern 111. The fin pattern 110F may protrude from the top surface of the substrate 100 and extend in the first direction X1. The fin pattern 110F may be formed by etching a portion of the substrate 100, or may be an epitaxial layer grown from the substrate 100. For example, the fin pattern 110F may be formed by partially removing an upper portion of the substrate 100 by etching, and thus may be integrally formed with the substrate 100, but the present disclosure is not limited thereto. In an embodiment of the present disclosure, the fin pattern 110F may be omitted.

In an embodiment of the present disclosure, the second active pattern 110B may include a plurality of upper sheet patterns (e.g., fourth to sixth sheet patterns 114 to 116) spaced apart from the first active pattern 110A. The fourth to sixth sheet patterns 114 to 116 may be sequentially stacked and may be disposed on the first active pattern 110A and may be spaced apart from each other and may extend in the first direction X1. The upper sheet patterns may be used as channel areas of MBCFET® including a multi-bridge channel. The number of the upper sheet patterns is only an example, and the present disclosure is not limited thereto.

The field insulating film 105 may be formed on the substrate 100. The field insulating film 105 may cover at least a portion of a side surface of the first active pattern 110A. For example, as shown in FIG. 3, the field insulating film 105 may cover a portion of a side surface of the fin pattern 110F. The fin pattern 110F may be defined on the substrate 100 by the field insulating film 105 filling a substrate trench. For example, the fin pattern 110F may correspond to portions of the substrate 100 that are surrounded by the field insulating film 105. The field insulating film 105 may include, for example, at least one of silicon oxide ($SiO_2$), silicon nitride ($Si_3N_4$), silicon oxynitride (SiON), or combinations thereof. However, the present disclosure is not limited thereto.

The isolation pattern 120 may be interposed between the first active pattern 110A and the second active pattern 110B. For example, the isolation pattern 120 may be interposed between a topmost sheet pattern (e.g., the third sheet pattern 113) among the lower sheet patterns and a bottommost sheet pattern, (e.g., the fourth sheet pattern 114) among the upper sheet patterns. The isolation pattern 120 may isolate the first active pattern 110A and the second active pattern 110B from each other. The isolation pattern 120 may include an insulating material such as, for example, at least one of silicon oxide ($SiO_2$), silicon nitride ($Si_3N_4$), silicon oxynitride (SiON), or a combination thereof. However, the present disclosure is not limited thereto. Since the isolation pattern 120 may include an insulating material, the first active pattern 110A and the second active pattern 110B may be electrically insulated from each other by the isolation pattern 120.

In an embodiment of the present disclosure, the isolation pattern 120 may fill an area between the first active pattern 110A and the second active pattern 110B. For example, a bottom surface of the isolation pattern 120 may contact a topmost sheet pattern (e.g., the third sheet pattern 113) among the lower sheet patterns, while a top surface of the isolation pattern 120 may contact a bottommost sheet pattern (e.g., the fourth sheet pattern 114) among the upper sheet patterns. For example, the isolation pattern 120 may be directly interposed between the third sheet pattern 113 and the fourth sheet pattern 114.

The first gate structure G1 and the second gate structure G2 may be formed on the substrate 100 and the field insulating film 105. Each of the first and second gate structures G1 and G2 may intersect the first active pattern 110A and the second active pattern 110B. For example, each of the first and second gate structures G1 and G2 may extend in the second direction Y1 parallel to a top surface of the substrate 100 and intersecting the first direction X1. The first gate structure G1 and the second gate structure G2 may be spaced apart from each other in the first direction X1 and may extend in a parallel manner to each other (see FIG. 1).

Each of the first active pattern 110A and the second active pattern 110B may pass through the first and second gate structures G1 and G2 in the first direction X1. For example, each of the first and second gate structures G1 and G2 may surround side surfaces of the lower sheet patterns (e.g., the first to third sheet patterns 111 to 113) and side surfaces of the upper sheet patterns (e.g., of the fourth to sixth sheet patterns 114 to 116). The first and second gate structures G1 and G2 may cover the part of the first active pattern 110A that protrude upwardly from the substrate 100 beyond the top surface of the first field insulating film 105. For example, the first and second gate structures G1 and G2 may cover a top portion of the fin pattern 110F.

In an embodiment of the present disclosure, each of the first and second gate structures G1 and G2 may include a gate dielectric film 132, gate electrodes 134A and 134B, a gate spacer 136 and a gate capping pattern 138.

The gate electrodes 134A and 134B may be formed on the substrate 100 and the field insulating film 105. The gate electrodes 134A and 134B may extend in the second direction Y1 so as to intersect the first active pattern 110A and the second active pattern 110B. Each of the gate electrodes 134A and 134B may include, for example, at least one of titanium nitride (TiN), tungsten nitride (WN), tantalum nitride (TaN), ruthenium (Ru), titanium carbide (TiC), tungsten carbide (WC), tantalum carbide (TaC), titanium (Ti), tantalum (Ta), silver (Ag), copper (Cu), gold (Au), cobalt (Co), nickel (Ni), platinum (Pt), aluminum (Al), titanium aluminum (TiAl), titanium aluminum nitride (TiAlN), tantalum aluminum nitride (TaAlN), tantalum titanium nitride (TaTiN), titanium aluminum carbide (TiAlC), tantalum carbonitride (TaCN), titanium silicon nitride (TiSiN), tantalum silicon nitride (TaSiN), manganese (Mn), zirconium (Zr), rhodium (Rh), palladium (Pd), iridium (Ir), osmium (Os), zinc (Zn), vanadium (V), tungsten (W), or combinations thereof. However, the present disclosure is not limited thereto.

The gate electrodes 134A and 134B may be formed using a replacement process. However, the present disclosure is not limited thereto. It is illustrated that each of the gate electrodes 134A and 134B is embodied as a single film. However, this is only an example, and each of the gate electrodes 134A and 134B may be formed by stacking a plurality of conductive layers. For example, each of the gate electrodes 134A and 134B may include a work-function control film that controls a work-function and a filling conductive film that fills a space defined by the work-function control film. The work-function control film may include, for example, at least one of titanium nitride (TiN), tantalum nitride (TaN), titanium carbide (TiC), tantalum carbide (TaC), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), titanium aluminum carbonitride (TiAlCN), tantalum carbonitride (TaCN), niobium nitride (NbN), niobium carbide (NbC), molybdenum nitride (MoN), molybdenum carbide (MoC), tungsten carbide (WC), titanium aluminum carbide (TiAlC), or combinations thereof. The filling conductive film may include, for example, tungsten (W) or aluminum (Al).

In an embodiment of the present disclosure, the gate electrodes 134A and 134B may include the lower gate electrode 134A and the upper gate electrode 134B stacked on the lower gate electrode 134A. The lower gate electrode 134A may extend in the second direction Y1 and intersect the first active pattern 110A. The upper gate electrode 134B may be disposed on the lower gate electrode 134A and extend in the second direction Y1 and intersect the second active pattern 110B.

The lower gate electrode 134A and the upper gate electrode 134B may include different materials. For example, the lower gate electrode 134A may include a first conductivity type metal, and the upper gate electrode 134B may include a second conductivity type metal. In one example, when the first active pattern 110A is used as a channel area of a PFET and the second active pattern 110B is used as a channel area of an NFET, the lower gate electrode 134A may include a p-type work-function metal, and the upper gate electrode 134B may include an n-type work-function metal. The p-type work-function metal may include, for example, at least one of aluminum (Al), aluminum oxide ($Al_2O_3$), titanium nitride (TiN), tungsten nitride (WN), cobalt (Co), nickel (Ni), or ruthenium oxide ($RuO_2$). However, the present disclosure is not limited thereto. The n-type work-function metal may include, for example, at least one of lanthanum (La), lanthanum oxide ($La_2O_3$), tantalum (Ta), tantalum nitride (TaN), niobium (Nb), or titanium nitride (TiN). However, the present disclosure is not limited thereto.

In FIG. 3, it is illustrated that the lower gate electrode 134A and the upper gate electrode 134B are in contact with each other. However, this is only an example. In another example, the lower gate electrode 134A and the upper gate electrode 134B may be electrically insulated from each other via an insulating layer or the like.

The gate dielectric film 132 may be interposed between the first active pattern 110A and the gate electrodes 134A and 134B and between the second active pattern 110B and the gate electrodes 134A and 134B. The gate dielectric film 132 may surround side surfaces of the lower sheet patterns (e.g., the first to third sheet patterns 111 to 113) and side surfaces of the upper sheet patterns (e.g., of the fourth to sixth sheet patterns 114 to 116). Further, the gate dielectric film 132 may be interposed between the fin pattern 110F and the gate electrodes 134A and 134B and between the field insulating film 102 and the gate electrodes 134A and 134B.

The gate dielectric film 132 may include, for example, at least one of silicon oxide ($SiO_2$), silicon oxynitride (SiON), silicon nitride ($Si_3N_4$), or a high-k material having a dielectric constant higher than that of silicon oxide ($SiO_2$). The high dielectric constant (high-k) material may include at least one of, for example, boron nitride (BN), hafnium oxide ($HfO_2$), hafnium zirconium oxide ($HfZrO_4$), hafnium tantalum oxide ($Hf_2Ta_2O_9$), hafnium silicon oxide ($HfSiO_4$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), lithium oxide ($Li_2O$), aluminum oxide ($Al_2O_3$), lead scandium tantalum oxide ($Pb(Sc,Ta)O_3$), or lead zinc niobate [$Pb(Zn_{1/3}Nb_{2/3})O_3$].

The semiconductor device according to an embodiment of the present disclosure may include an NC (Negative Capacitance) FET using a negative capacitor. For example, the gate dielectric film 132 may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may increase. Using the increase in the total capacitance value, a transistor including the ferroelectric material film may have a subthreshold swing (SS) lower than about 60 mV/decade at room temperature. For example, in a negative capacitance FET (NC-FET), the insulating ferroelectric material layer served as a negative capacitor so that channel surface potential can be amplified more than the gate voltage, and hence the device can operate with SS less than 60 mV/decade at room temperature.

The ferroelectric material film may have ferroelectric properties. The ferroelectric material film may include, for example, at least one of hafnium oxide ($HfO_2$), hafnium zirconium oxide ($HfZrO_4$), barium strontium titanium oxide ($BaSrTi_2O_6$), barium titanium oxide ($BaTiO_3$), or lead zirconium titanium oxide ($Pb(Ti,Zr)O_3$). Each of the ferroelectric materials described above, the ratio between metals may vary and the composition may be nonstoichiometric. In this case, in one example, hafnium zirconium oxide ($HfZrO_4$) may refer to a material obtain by doping hafnium oxide ($HfO_2$) with zirconium (Zr). In another example, hafnium zirconium oxide ($HfZrO_4$) may refer to a compound of hafnium (Hf), zirconium (Zr), and oxygen (O). In other words, hafnium zirconium oxide may be represented by $Hf_xZr_yO_z$ with various combinations of numerical values of x, y and z instead of being represented by $HfZrO_4$.

The ferroelectric material film may further contain doped dopants. For example, the dopant may include at least one of, for example, aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) or tin (Sn). A type of the dopant contained in the ferroelectric material film may vary depending on a type of the ferroelectric material included in the ferroelectric material film.

When the ferroelectric material film includes hafnium oxide ($HfO_2$), the dopant contained in the ferroelectric material film may include, for example, at least one of gadolinium (Gd), silicon (Si), zirconium (Zr), aluminum (Al), or yttrium (Y). However, the present disclosure is not limited thereto. For example, other dopants such as, for example, strontium (Sr), lanthanum (La), titanium (Ti) and tantalum (Ta) may also be used to dope the ferroelectric material layer including hafnium oxide ($HfO_2$).

When the dopant is aluminum (Al), the ferroelectric material film may contain about 3 to about 8 at % (atomic %) of aluminum (Al). In this case, a content of the dopant may be a content of aluminum (Al) based on a sum of hafnium (Hf) and aluminum (Al).

When the dopant is silicon (Si), the ferroelectric material film may contain about 2 to about 10 at % of silicon (Si). When the dopant is yttrium (Y), the ferroelectric material film may contain about 2 to about 10 at % yttrium (Y). When the dopant is gadolinium (Gd), the ferroelectric material film may contain about 1 to about 7 at % gadolinium (Gd). When the dopant is zirconium (Zr), the ferroelectric material film may contain about 50 to about 80 at % zirconium (Zr).

The paraelectric material film may have paraelectric properties. The paraelectric material film may include, for example, at least one of silicon oxide ($SiO_2$) or metal oxide having a high dielectric constant. Although the metal oxide contained in the paraelectric material film may include, for example, at least one of hafnium oxide ($HfO_2$), barium strontium titanium oxide ($BaSrTi_2O_6$), zirconium oxide ($ZrO_2$), or aluminum oxide ($Al_2O_3$). However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide ($HfO_2$), a crystal structure of hafnium oxide ($HfO_2$) contained in the ferroelectric material film is different from a crystal structure of hafnium oxide ($HfO_2$) contained in the paraelectric material film.

The ferroelectric material film may have exhibit ferroelectric properties, when its thickness is in a specific range. Although the thickness of the ferroelectric material film may be, for example, in a range of about 0.5 to about 10 nm, the present disclosure is not limited thereto. Because a critical thickness exhibiting the ferroelectric properties varies based on a type of the ferroelectric material, the thickness of the ferroelectric material film may vary depending on the type of the ferroelectric material.

In one example, the gate dielectric film 132 may include one ferroelectric material film. In another example, the gate dielectric film 132 may include a plurality of ferroelectric material films spaced apart from each other. The gate dielectric film 132 may have a multilayer structure in which a plurality of ferroelectric material films and a plurality of paraelectric material films are alternately stacked on top of each other.

In an embodiment of the present disclosure, an interfacial film 131 may be formed between each of the sheet patterns 111 to 116 and the gate dielectric film 132. The interfacial film 131 may include an oxide of each of the sheet patterns 111 to 116. For example, the interfacial film 131 may include silicon oxide ($SiO_2$). However, the present disclosure is not limited thereto.

The gate spacer 136 may be formed on the substrate 100 and the field insulating film 105. The gate spacer 136 may extend along a side surface of each of the gate electrodes 134A and 134B. In an embodiment of the present disclosure, a portion of the gate dielectric film 132 may be interposed between each of the gate electrodes 134A and 134B and the gate spacer 136. For example, the gate dielectric film 132 may further extend along an inner side surface of the gate spacer 136. The gate dielectric film 132 may be formed using a replacement process. However, the present disclosure is not limited thereto.

The gate spacer 136 may include, for example, at least one of silicon nitride ($Si_3N_4$), silicon oxynitride (SiON), silicon oxycarbide (SiOC), silicon boron nitride (SiBN), silicon carbonitride (SiCN), silicon oxycarbonitride (SiOCN), or combinations thereof. However, the present disclosure is not limited thereto. In an embodiment of the present disclosure, the gate spacer 136 may have a multi-layered structure, which includes at least two different materials selected from, for example, silicon nitride ($Si_3N_4$), silicon oxynitride (SiON), silicon oxycarbide (SiOC), silicon boron nitride (SiBN), silicon carbonitride (SiCN), and silicon oxycarbonitride (SiOCN).

The gate capping pattern 138 may cover at least a portion of a top surface of the upper gate electrode 134B. For example, the gate capping pattern 138 may extend along the top surface of the upper gate electrode 134B. It is illustrated that a top surface of the gate spacer 136 is coplanar with a top surface of the gate capping pattern 138. However, this is only an example. In an embodiment of the present disclosure, the gate capping pattern 138 may be formed to cover the top surface of the gate spacer 136. For example, the top surface of the gate spacer 136, the top surface of the upper gate electrode 134B and a top surface of the gate dielectric film 132 may be coplanar.

The gate capping pattern 138 may include, for example, at least one of silicon nitride ($Si_3N_4$), silicon oxynitride (SiON), silicon oxycarbide (SiOC), silicon boron nitride (SiBN), silicon carbonitride (SiCN), silicon oxycarbonitride (SiOCN), or combinations thereof. However, the present disclosure is not limited thereto.

The first epitaxial pattern 160A may be formed on the top surface of the substrate 100 and side surfaces of the first and second gate structures G1 and G2. The first epitaxial pattern 160A may be connected to the first active pattern 110A. For example, each of the first to third sheet patterns 111 to 113 may extend through the first and second gate structures G1 and G2 so as to be connected to the first epitaxial pattern 160A. The first epitaxial pattern 160A may be electrically insulated from the gate electrodes 134A and 134B via the gate dielectric film 132 and/or the gate spacer 136. The first epitaxial pattern 160A may act as a source/drain area of a field effect transistor including the first active pattern 110A and the first and second gate structures G1 and G2. The first active pattern 110A may be used as a channel area of the field effect transistor.

The first epitaxial pattern 160A may include an epitaxial layer grown using the substrate 100 (or the fin pattern 110F) and the first active pattern 110A as a seed layer or seed layers. For example, the first epitaxial pattern 160A may be an epitaxial layer grown from the top surface of the substrate 100 and a side surface of the first active pattern 110A using an epitaxial growth scheme. In an embodiment of the present disclosure, the first epitaxial pattern 160A may be formed by a selective epitaxial growth (SEG) process.

The second epitaxial pattern 160B may be formed on a top surface of the first epitaxial pattern 160A and the side surfaces of the first and second gate structures G1 and G2. The second epitaxial pattern 160B may be connected to the second active pattern 110B. For example, each of the fourth to sixth sheet patterns 114 to 116 may extend through the first and second gate structures G1 and G2 so as to be connected to the second epitaxial pattern 160B. The second epitaxial pattern 160B may be electrically insulated from the gate electrodes 134A and 134B via the gate dielectric film 132 and/or the gate spacer 136. The second epitaxial pattern 160B may act as a source/drain area of a field effect transistor including the second active pattern 110B and the first and second gate structures G1 and G2. The second active pattern 110B may be used as a channel area of the field effect transistor.

The second epitaxial pattern 160B may include an epitaxial layer grown using the second active pattern 110B and the semiconductor film 150 described later as a seed layer or seed layers. For example, the second epitaxial pattern 160B may be an epitaxial layer grown from a top surface of the semiconductor film 150 and a side surface of the second active pattern 110B using an epitaxial growth scheme. In an embodiment of the present disclosure, the second epitaxial pattern 160B may be formed by a selective epitaxial growth (SEG) process.

Each of the first epitaxial pattern 160A and the second epitaxial pattern 160B is illustrated as being embodied as a single film. However, this is only an example. In another example, each of the first epitaxial pattern 160A and the second epitaxial pattern 160B may be embodied as multiple layers respectively including impurities of different concentrations.

In an embodiment of the present disclosure, the first epitaxial pattern 160A and the second epitaxial pattern 160B may have different conductivity types. For example, the first epitaxial pattern 160A may have a first conductivity type, and the second epitaxial pattern 160B may have a second conductivity type different from the first conductivity type. In one example, the first conductivity type may be a p-type and the second conductivity type may be an n-type. In this case, the first active pattern 110A may be used as a channel area of the PFET, and the second active pattern 110B may be used as a channel area of the NFET. However, this is only an example. In another example, the first conductivity type may be an n-type and the second conductivity type may be a p-type.

When an element including the first active pattern 110A or the second active pattern 110B is a p-type element (e.g., a PFET), the first epitaxial pattern 160A or the second epitaxial pattern 160B may contain p-type impurities or impurities to prevent diffusion of the p-type impurities. For example, the first epitaxial pattern 160A or the second epitaxial pattern 160B may contain at least one of, for example, boron (B), carbon (C), indium (In), gallium (Ga), aluminum (Al), or combinations thereof.

In an embodiment of the present disclosure, when the element including the first active pattern 110A or the second active pattern 110B is a p-type element (e.g., a PFET), the first epitaxial pattern 160A or the second epitaxial pattern 160B may include a compressive stress material. For example, when the first active pattern 110A or the second active pattern 110B is embodied as a silicon (Si) pattern, the first epitaxial pattern 160A or the second epitaxial pattern 160B may include a material (e.g., silicon germanium (SiGe)) having a larger lattice constant than that of silicon (Si). The compressive stress material may apply a compressive stress to the first active pattern 110A or the second active pattern 110B to enhance carrier mobility in the channel area. For example, silicon germanium (SiGe) in the PFET source/drain area may cause uniaxial compressive strain in the channel (e.g., the first active pattern 110A or the second active pattern 110B), thereby increasing hole mobility.

When the element including the first active pattern 110A or the second active pattern 110B is an n-type element, (e.g., an NFET), the first epitaxial pattern 160A or the second epitaxial pattern 160B may contain n-type impurities or impurities to prevent diffusion of the n-type impurities. For example, the first epitaxial pattern 160A or the second epitaxial pattern 160B may contain at least one of, for example, phosphorus (P), antimony (Sb), arsenic (As), bismuth (Bi) or combinations thereof.

In an embodiment of the present disclosure, when the element including the first active pattern 110A or the second active pattern 110B is an n-type element, (e.g., an NFET), the first epitaxial pattern 160A or the second epitaxial pattern 160B may include a tensile stress material. For example, when the first active pattern 110A or the second active pattern 110B is embodied as a silicon (Si) pattern, the first epitaxial pattern 160A or the second epitaxial pattern 160B may include a material (e.g., silicon carbide (SiC)) having a smaller lattice constant than that of silicon (Si). The tensile stress material may apply a tensile stress to the first active pattern 110A or the second active pattern 110B to enhance carrier mobility in the channel area. For example, the structure that facilitates exerting tensile stress on the channel region by including silicon carbide (SiC) in the first epitaxial pattern 160A or the second epitaxial pattern 160B may enhance the electron mobility and reduces the channel (e.g., the first active pattern 110A or the second active pattern 110B) resistance.

The insulating pattern 140 may be interposed between the first epitaxial pattern 160A and the second epitaxial pattern 160B. Further, the insulating pattern 140 may be formed on a side surface of the isolation pattern 120. The insulating pattern 140 may include an insulating material, for example, at least one of silicon oxide ($SiO_2$), silicon nitride ($Si_3N_4$), silicon oxynitride (SiON), or a combination thereof. However, the present disclosure is not limited thereto. The insulating pattern 140 may electrically insulate the first epitaxial pattern 160A and the second epitaxial pattern 160B from each other.

In an embodiment of the present disclosure, a vertical level of the insulating pattern 140 may be lower than that of the isolation pattern 120. For example, a height from the top surface of the substrate 100 to a top surface of the insulating pattern 140 may be smaller than a height from the top surface of the substrate 100 to a top surface of the isolation pattern 120. In this case, a vertical level of the top surface of the insulating pattern 140 may be lower than that of a bottom surface of the bottommost sheet pattern (e.g., the fourth sheet pattern 114) among the upper sheet patterns.

In an embodiment of the present disclosure, a height from the top surface of the substrate 100 to a bottom surface of the insulating pattern 140 may be larger than a height from the top surface of the substrate 100 to a bottom surface of the isolation pattern 120. In this case, a vertical level of the bottom surface of the insulating pattern 140 may be higher than that of a top surface of the topmost sheet pattern (e.g., the third sheet pattern 113) among the lower sheet patterns. However, the present disclosure is not limited thereto.

The liner film 142 may be interposed between the isolation pattern 120 and the insulating pattern 140. For example, the liner film 142 may conformally extend along a side surface of the insulating pattern 140. The liner film 142 may include an insulating material, for example, at least one of silicon oxide ($SiO_2$), silicon nitride ($Si_3N_4$), silicon oxynitride (SiON), or combinations thereof. However, the present disclosure is not limited thereto.

In an embodiment of the present disclosure, the liner film 142 may include an insulating material different from that of the insulating pattern 140. For example, the insulating pattern 140 may include silicon oxide ($SiO_2$), and the liner film 142 may include silicon nitride ($Si_3N_4$).

It is illustrated that a top surface of the liner film 142 is coplanar with the top surface of the insulating pattern 140. However, this is only an example. A vertical level of the top surface of the liner film 142 may be higher or lower than that of the top surface of the insulating pattern 140. It is illustrated that a bottom surface of the liner film 142 is coplanar with a bottom surface of the insulating pattern 140. However, this is only an example. A vertical level of the bottom surface of the liner film 142 may be higher or lower than a vertical level of the bottom surface of the insulating pattern 140.

The semiconductor film 150 may be interposed between the insulating pattern 140 and the second epitaxial pattern 160B. The semiconductor film 150 may extend along the top surface of the insulating pattern 140. For example, the semiconductor film 150 may conformally extend along the top surface of the insulating pattern 140 and the top surface of the liner film 142.

In an embodiment of the present disclosure, a vertical level of the top surface of the semiconductor film 150 may be lower than that of the top surface of the isolation pattern 120. However, the present disclosure is not limited thereto.

The semiconductor film 150 may function as the seed layer used for forming the second epitaxial pattern 160B using an epitaxial growth scheme. For example, as described above, the second epitaxial pattern 160B may be an epitaxial layer grown from a top surface of the semiconductor film 150 and the side surface of the second active pattern 110B using an epitaxial growth scheme.

In an embodiment of the present disclosure, a top surface 160U of the second epitaxial pattern 160B may include a flat surface 160U1, a first inclined surface 160U2, and a second inclined surface 160U3. The flat surface 160U1 may be parallel to the top surface of substrate 100. The first inclined surface 160U2 may extend from one side of the flat surface 160U1, and the second inclined surface 160U3 may extend from the other side of the flat surface 160U1. For example, a portion of the second epitaxial pattern 160B disposed between the first gate structure G1 and the second gate structure G2 may include the first inclined surface 160U2 between the first gate structure G1 and the flat surface 160U1, and the second inclined surface 160U3 between the second gate structure G2 and the flat surface 160U1. An angle defined between each of the first inclined surface 160U2 and the second inclined surface 160U3 and the flat surface 160U1 may be an obtuse angle. For example, an angle defined between the first inclined surface 160U2 and the flat surface 160U1 may be a first obtuse angle $\theta1$, while an angle defined between the second inclined surface 160U3 and the flat surface 160U1 may be a second obtuse angle $\theta2$. This shape of the top surface 160U of the second epitaxial pattern 160B may be due to a fact that the second epitaxial pattern 160B is formed from the second active pattern 110B and the semiconductor film 150 using an epitaxial growth scheme. For example, an epitaxial layer may be grown from the top surface of the semiconductor film 150 and the both opposing side surfaces of the second active pattern 110B, for example, may be grown from three surfaces, using an epitaxial growth scheme to form the second epitaxial pattern 160B in a merged manner. The merged structure of the second active pattern 110B may have the top surface 160U including the flat surface 160U1, the first inclined surface 160U2, and the second inclined surface 160U3.

Further, as the second epitaxial pattern 160B is grown from the top surface of the semiconductor film 150, a bottom surface 160L of the second epitaxial pattern 160B may entirely contact the top surface of the semiconductor film 150. For example, as shown, when the top surface of the semiconductor film 150 is parallel to the top surface of the substrate 100, the bottom surface 160L of the second epitaxial pattern 160B may be parallel to the top surface of the substrate 100.

In an embodiment of the present disclosure, the semiconductor film 150 may include a polycrystalline semiconductor material. In one example, the semiconductor film 150 may include a polysilicon (p-Si) film. In this case, the second epitaxial pattern 160B formed from the semiconductor film 150 using an epitaxial growth scheme may include a polycrystalline film. For example, a lower portion of the second epitaxial pattern 160B adjacent to the semiconductor film 150 may be polycrystalline. In an embodiment of the present disclosure, when the second active pattern 110B is a p-type element (e.g., a PFET), the second epitaxial pattern 160B formed from the semiconductor film 150 using an epitaxial growth scheme may include a material (e.g., silicon germanium (SiGe)) having a larger lattice constant than that of silicon (Si). In an embodiment of the present disclosure, when the second active pattern 110B is a n-type element (e.g., an NFET), the second epitaxial pattern 160B formed from the semiconductor film 150 using an epitaxial growth scheme may include a material (e.g., silicon carbide (SiC)) having a smaller lattice constant than that of silicon (Si).

The interlayer insulating film 190 may be formed on the substrate 100 and the field insulating film 105. The interlayer insulating film 190 may be formed to fill a space on an outer side surface of the gate spacer 136. For example, the interlayer insulating film 190 may cover the outer side surface of the gate spacer 136 and the top surface of the second epitaxial pattern 160B. Although it is illustrated that the interlayer insulating film 190 does not cover a top surface of each of the first and second gate structures G1 and G2, this is only an example, and the interlayer insulating film 190 may cover the top surface of each of the first and second gate structures G1 and G2.

The interlayer insulating film 190 may include, for example, at least one of silicon oxide ($SiO_2$), silicon nitride ($Si_3N_4$), silicon oxynitride (SiON), silicon oxycarbide (SiOC), silicon boron nitride (SiBN), silicon carbonitride (SiCN), silicon oxycarbonitride (SiOCN), or a low dielectric constant (low-k) material. The low dielectric constant (low-K) material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyl di siloxane (HMDS), trimethylsilyl borate (TMSB), diacetoxyditertiarybutosiloxane (DADBS), trimethylsilil phosphate (TMSP), polytetrafluoroethylene (PTFE), Tonen SilaZen (TOSZ), fluoride silicate glass (FSG), polyimide nanofoams such as polypropylene oxide, carbon doped silicon oxide (SiOCH), organo silicate glass (OSG), SiLK, amorphous fluorinated carbon, silica aerogels, silica xerogels, mesoporous silica, or combinations thereof. However, the present disclosure is not limited thereto.

The first source/drain contact 180A may be electrically connected to the first epitaxial pattern 160A. The first source/drain contact 180A may also be referred to as a "lower source/drain contact". For example, the first source/drain contact 180A may be interposed between the first epitaxial pattern 160A and the insulating pattern 140 and may contact the top surface of the first epitaxial pattern 160A. It is illustrated that the liner film 142 extends only from a top surface of the first source/drain contact 180A. However, this is only an example. In another example, the liner film 142 may extend along a portion of a side surface of the first source/drain contact 180A.

In an embodiment of the present disclosure, a vertical level of the lowermost surface of the first source/drain contact 180A may be lower than that of the uppermost surface of the first epitaxial pattern 160A. The uppermost surface of the first epitaxial pattern 160A may be the uppermost portion of each of the two inclined top surfaces of the epitaxial pattern 160A respectively adjacent to the first gate structure G1 and the second gate structure G2. For example, as shown in FIG. 2, a top surface of the first epitaxial pattern 160A may include a contact recess 160R, and at least a portion of the first source/drain contact 180A may be formed to fill the contact recess 160R.

The second source/drain contact 180B may be electrically connected to the second epitaxial pattern 160B. The second source/drain contact 180B may also be referred to as an "upper source/drain contact". For example, the second source/drain contact 180B may pass through the interlayer insulating film 190 in the third direction Z1 and may contact a top surface of the second epitaxial pattern 160B. It is illustrated that a vertical level of a bottom surface of the second source/drain contact 180B is lower than that of the flat surface 160U1. However, this is only an example. In another example, the bottom surface of the second source/drain contact 180B may be coplanar with the flat surface 160U1. In still another example, the second source/drain contact 180B may extend through the second epitaxial pattern 160B.

It is illustrated that each of the first source/drain contact 180A and the second source/drain contact 180B is embodied as a single film. However, this is only an example, and each of the first source/drain contact 180A and the second source/drain contact 180B may be embodied as a stack of a plurality of conductive layers. For example, each of the first source/drain contact 180A and the second source/drain contact 180B may include a silicide film and a filling conductive film that are sequentially stacked. The silicide layer may include a metal such as, for example, platinum (Pt), nickel (Ni), or cobalt (Co) to react with silicon (Si) to form a metal silicide such as, for example, platinum silicide (PtSi), nickel silicide ($NiSi_2$), or cobalt silicide ($CoSi_2$). However, the present disclosure is not limited thereto. The filling conductive film may include, for example, titanium (Ti), titanium nitride (TiN), tungsten (W), aluminum (Al), or copper (Cu). However, the present disclosure is not limited thereto.

Figure 4:
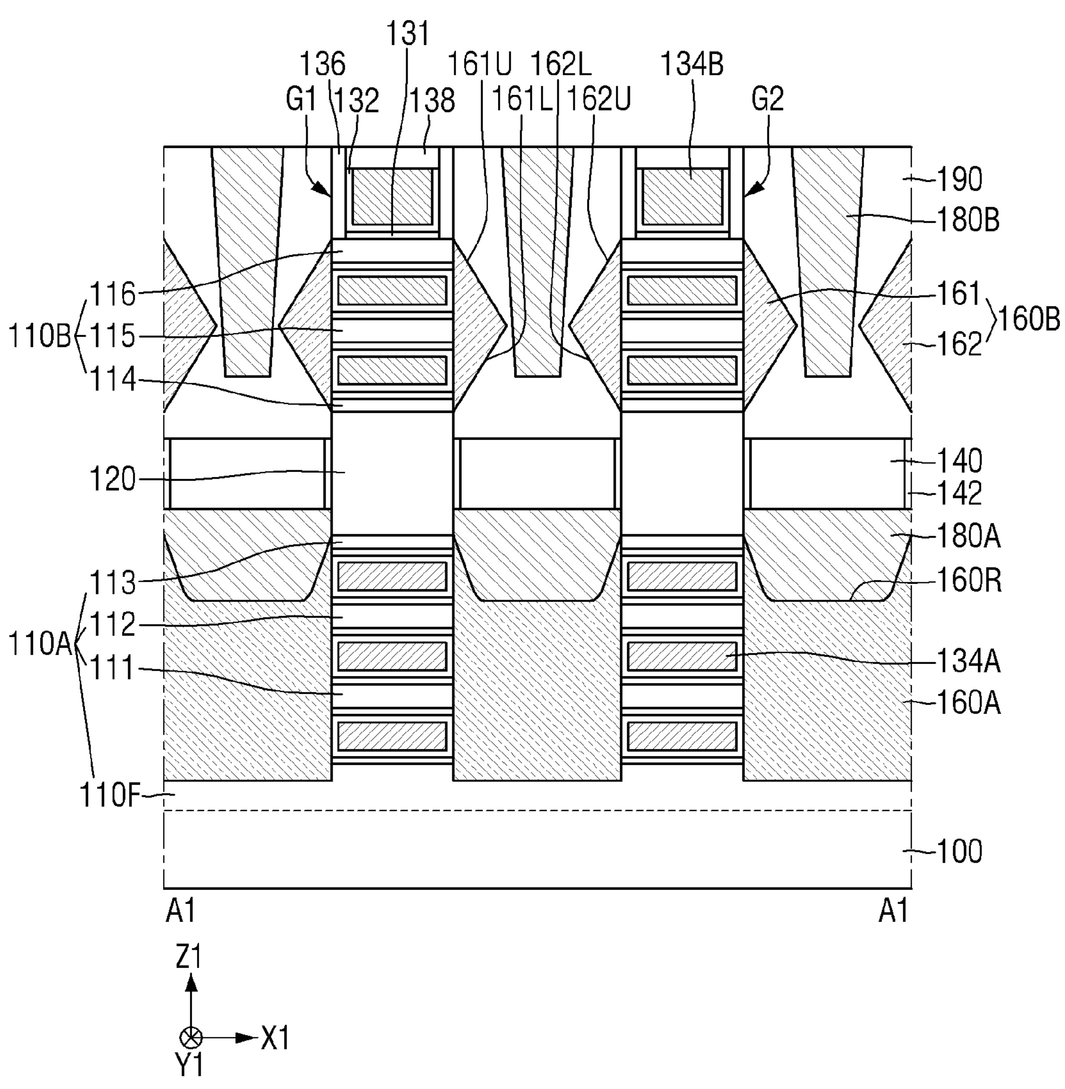
FIG. 4 to FIG. 6 are comparative diagrams each for illustrating an effect of the semiconductor device.
Figure 5:
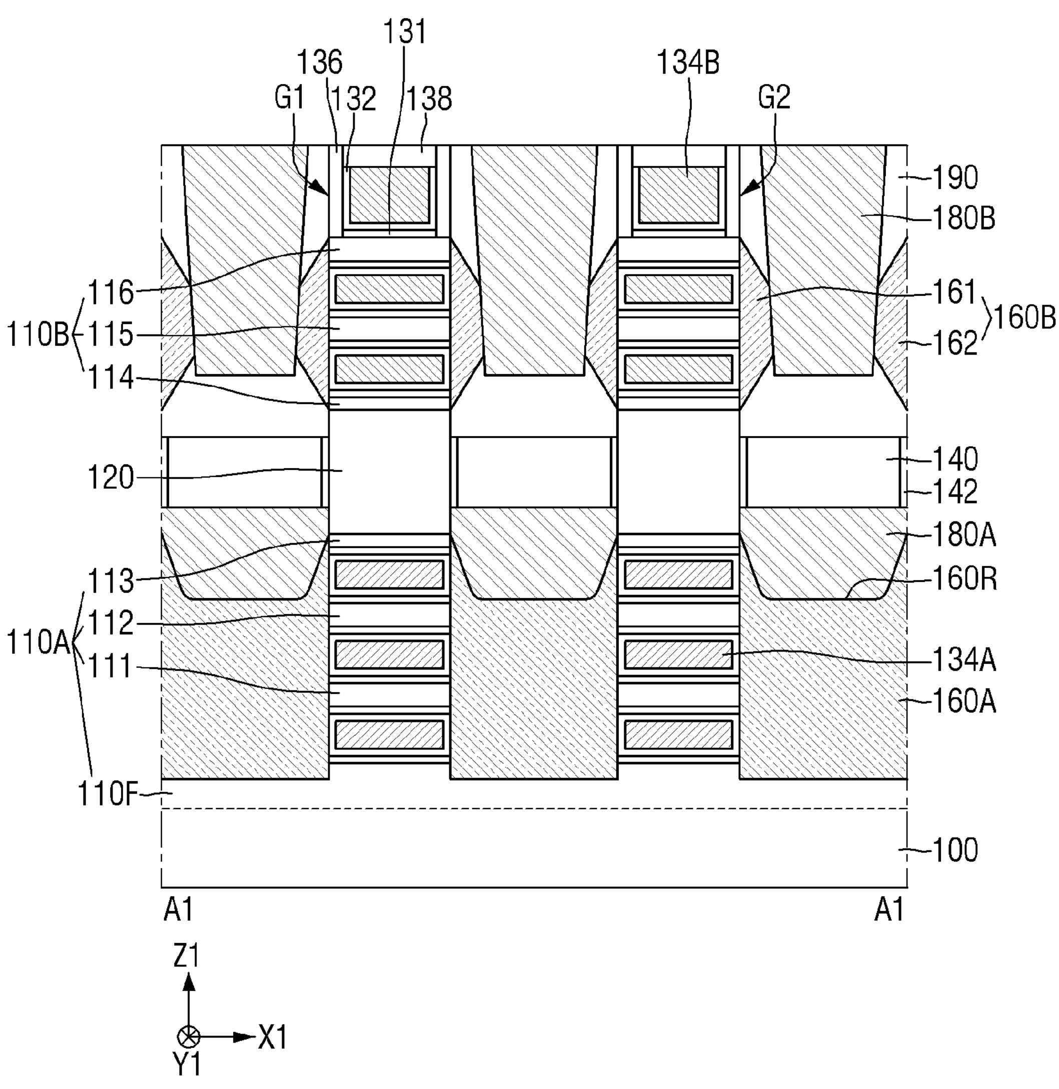
Figure 6:
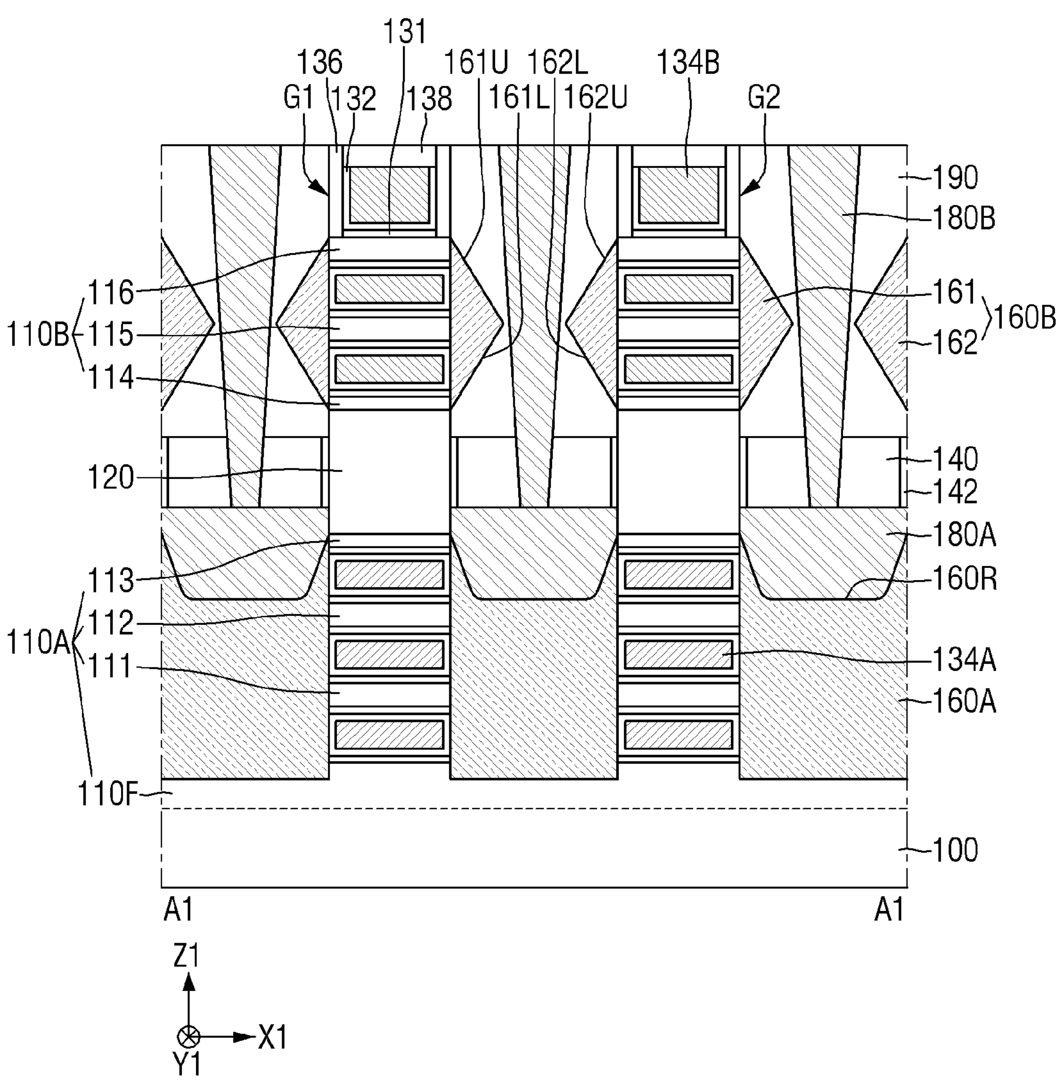

FIG. 4 to FIG. 6 are comparative diagrams each for illustrating an effect of the semiconductor device. For the convenience of description, those duplicate with the descriptions as set forth above with reference to FIG. 1 to FIG. 3 are briefly described or omitted.

As the demand for high performance electronic devices continues to grow, integration of the semiconductor device becomes increasingly higher. Thus, to implement a larger number of semiconductor devices in the same area, the semiconductor device using stacked multi-gate transistors is being studied. This semiconductor device may include a lower multi-gate transistor on a substrate and an upper multi-gate transistor stacked on the lower multi-gate transistor.

An epitaxial pattern may act as a source/drain area of the multi-gate transistor. However, unlike an epitaxial pattern of the lower multi-gate transistor, an epitaxial pattern of the upper multi-gate transistor may be formed in an unmerged manner due to absence of a substrate. For example, referring to FIG. 4 to FIG. 6, as the first epitaxial pattern 160A is grown from the top surface of the substrate 100 and both opposing side surfaces of the first active pattern 110A, for example, is grown from three surfaces, the first epitaxial pattern 160A may be formed in a merged manner. In contrast thereto, as the second epitaxial pattern 160B is grown only from the both opposing side surfaces of the second active pattern 110B, for example, is grown from two surfaces, the second epitaxial pattern 160B may be formed in an unmerged manner.

A portion of the second epitaxial pattern 160B disposed between the first gate structure G1 and the second gate structure G2 may include a first sub-pattern 161 and a second sub-pattern 162. The first sub-pattern 161 may be grown from a side surface of the second active pattern 110B intersecting with the first gate structure G1, while the second sub-pattern 162 may be grown from a side surface of the second active pattern 110B intersecting with the second gate structure G2. Further, the first sub-pattern 161 and the second sub-pattern 162 may be spaced apart from each other in the first direction X1 so as to constitute the unmerged second epitaxial pattern 160B.

In an embodiment of the present disclosure, each of the first sub-pattern 161 and the second sub-pattern 162 may include each of lower inclined surfaces 161L and 162L and each of upper inclined surfaces 161U and 162U. An angle defined between each of the lower inclined surfaces 161L and 162L and the top surface of the substrate 100 may be an acute angle, while an angle defined between each of the upper inclined surfaces 161U and 162U and the top surface of the substrate 100 may be an obtuse angle. This shape of the second epitaxial pattern 160B may be attributed to a fact that the second epitaxial pattern 160B is formed from the second active pattern 110B using an epitaxial growth scheme.

The second epitaxial pattern 160B formed in the unmerged manner may cause various problems in a manufacturing process of the semiconductor device.

In one example, as shown in FIG. 4, the second source/drain contact 180B may not be electrically connected to the unmerged second epitaxial pattern 160B. For example, the second source/drain contact 180B may be formed between the first sub-pattern 161 and the second sub-pattern 162, and may not come into contact with at least one of the first sub-pattern 161 or the second sub-pattern 162. For example, the electrical connection between the second source/drain contact 180B and the unmerged second epitaxial pattern 160B may not be secured when the first sub-pattern 161 and the second sub-pattern 162 are not in contact with the second source/drain contact 180B.

To ensure the electrical connection between the second source/drain contact 180B and the unmerged second epitaxial pattern 160B, a width of the second source/drain contact 180B may be increased as shown in FIG. 5. However, the second source/drain contact 180B having the increased width may cause a problem of excessively increasing parasitic capacitance between the second source/drain contact 180B and each of the first and second gate structures G1 and G2.

In another example, as shown in FIG. 6, a short-circuit may be formed between the first source/drain contact 180A and the second source/drain contact 180B. For example, in an etching process for forming the second source/drain contact 180B, the unmerged second epitaxial pattern 160B may not provide an end point of the etching process. Accordingly, an etchant may pass through the interlayer insulating film 190 and the insulating pattern 140 to expose a portion of the first source/drain contact 180A, such that the second source/drain contact 180B may contact the exposed portion of the first source/drain contact 180A. For example, without increasing the width of the second source/drain contact 180B, the electrical connection between the second source/drain contact 180B and the unmerged second epitaxial pattern 160B may not be secured, and after the etching process, the second source/drain contact 180B may contact the first source/drain contact 180A to cause electrical short.

Since the semiconductor device according to an embodiment of the present disclosure includes the semiconductor film 150, the formation of the aforementioned unmerged second epitaxial pattern 160B may be effectively prevented. For example, as described above with reference to FIG. 1 to FIG. 3, as the second epitaxial pattern 160B is grown from the top surface of the semiconductor film 150 and the both opposing side surfaces of the second active pattern 110B, the second epitaxial pattern 160B may be grown from three surfaces as the first epitaxial pattern 160A may be grown. Accordingly, the second epitaxial pattern 160B may be formed in a merged manner as the first epitaxial pattern 160A may. For example, as the semiconductor device according to an embodiment of the present disclosure including the semiconductor film 150, the electrical connection between the second source/drain contact 180B and the merged second epitaxial pattern 160B may be secured, and after the etching process, the second source/drain contact 180B contacting the first source/drain contact 180A to cause electrical short may be prevented.

FIG. 7 to FIG. 11 are various cross-sectional views for illustrating semiconductor devices each according to an embodiment of the present disclosure, respectively. For the convenience of description, those duplicate with the descriptions as set forth above with reference to FIG. 1 to FIG. 3 are briefly described or omitted.

Figure 7:
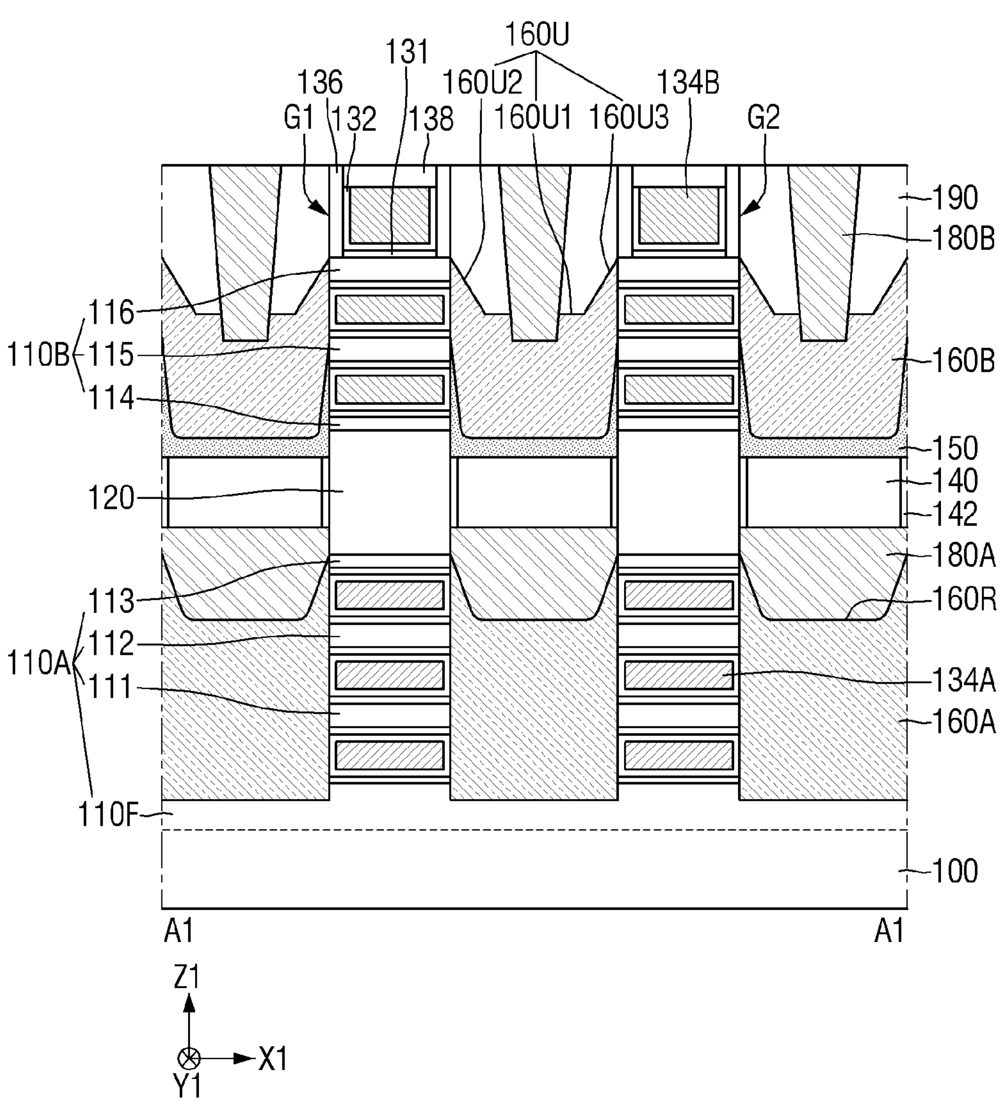
FIG. 7 to FIG. 11 are various cross-sectional views for illustrating semiconductor devices each according to an embodiment of the present disclosure, respectively.

Referring to FIG. 7, in a semiconductor device according to an embodiment of the present disclosure, a portion of the semiconductor film 150 further extends along a side surface of the second active pattern 110B and/or a side surface of each of the first and second gate structures G1 and G2.

The semiconductor film 150 may extend along the top surface of the insulating pattern 140, the top surface of the liner film 142, a portion of the side surface of the isolation pattern 120, a portion of the side surface of the second active pattern 110B, and a portion of the side surface of each of the first and second gate structures G1 and G2.

In an embodiment of the present disclosure, a thickness of a portion of the semiconductor film 150 extending along the side surface of the second active pattern 110B and/or the side surface of each of the first and second gate structures G1 and G2 may be smaller than a thickness of a portion of the semiconductor film 150 extending along the top surface of the insulating pattern 140 and/or the top surface of the liner film 142. In an embodiment of the present disclosure, the thickness of the portion of the semiconductor film 150 extending along the side surface of the second active pattern 110B and/or the side surface of each of the first and second gate structures G1 and G2 may decrease as the portion thereof extends away from the top surface of the insulating pattern 140. Since the semiconductor device according to an embodiment of the present disclosure including the semiconductor film 150 having a portion extending along a side surface of each of the first and second gate structures G1 and G2 as described above, an epitaxial layer may be grown from the top surface of the semiconductor film 150 and the both opposing side surfaces of the second active pattern 110B not covered by the semiconductor film 150 using an epitaxial growth scheme to form the second epitaxial pattern 160B in a merged manner.

Figure 8:
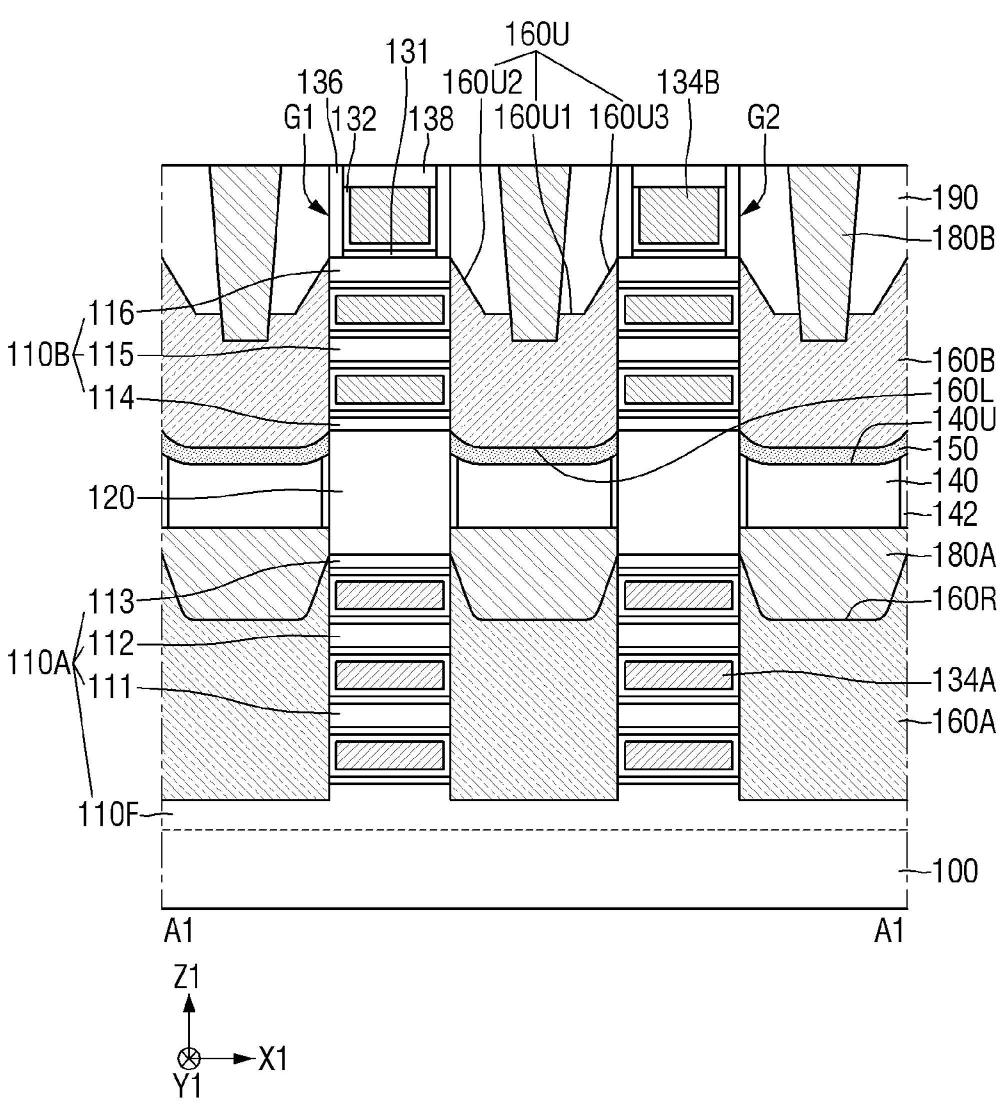

Referring to FIG. 8, in a semiconductor device according to an embodiment of the present disclosure, the top surface of the insulating pattern 140 is concave upwardly.

The top surface of the insulating pattern 140 may include a concavely-curved surface 140U. The semiconductor film 150 may conformally extend along the concavely-curved surface 140U. The bottom surface 160L of the second epitaxial pattern 160B may entirely contact the top surface of the semiconductor film 150. In this case, as shown, the bottom surface 160L of the second epitaxial pattern 160B may be convex downwardly. Since the semiconductor device according to an embodiment of the present disclosure including the semiconductor film 150 having a concavely-curved top surface as described above, an epitaxial layer may be grown from the top surface of the semiconductor film 150 and the both opposing side surfaces of the second active pattern 110B, for example, may be grown from three surfaces, using an epitaxial growth scheme to form the second epitaxial pattern 160B in a merged manner.

Figure 9:
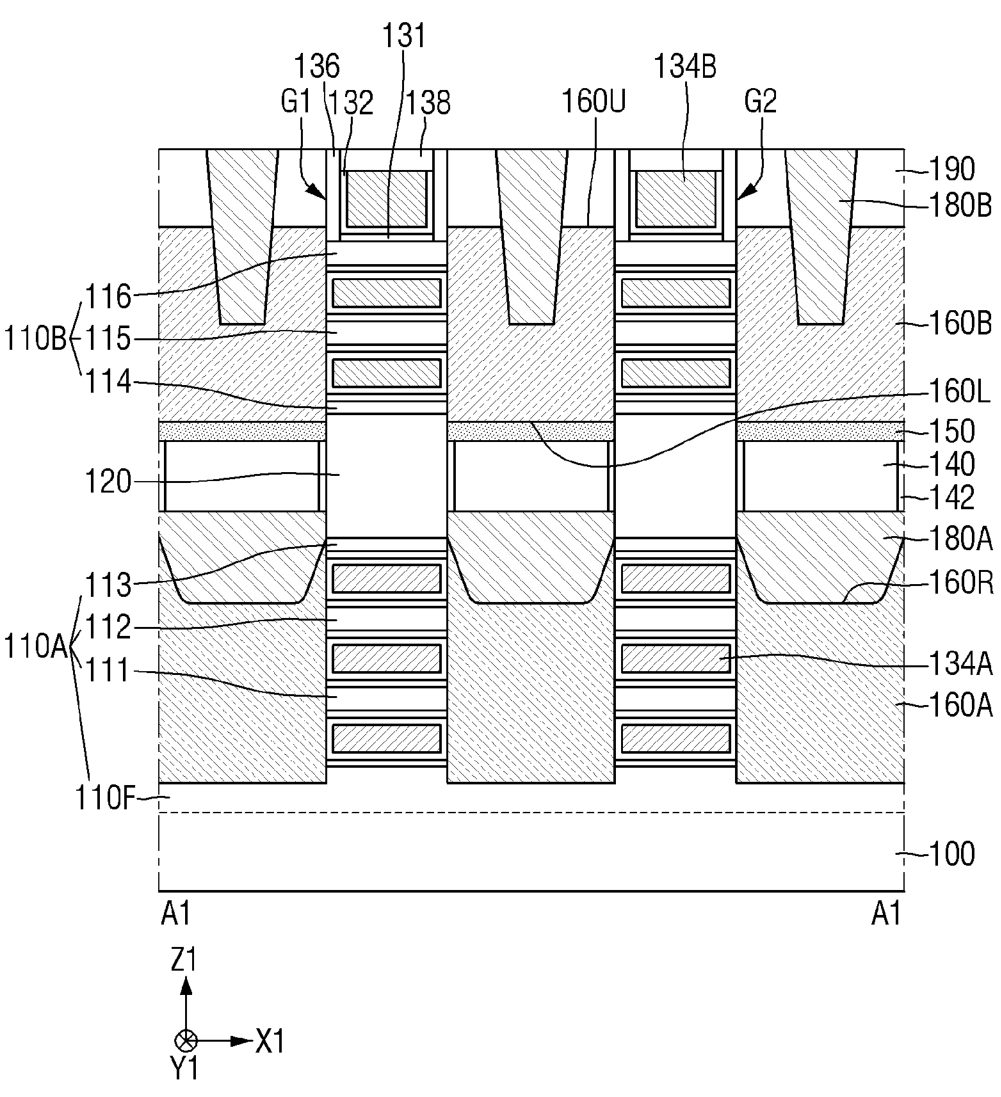

Referring to FIG. 9, in a semiconductor device according to an embodiment of the present disclosure, the top surface 160U of the second epitaxial pattern 160B is entirely parallel to the top surface of the substrate 100.

The top surface 160U of the second epitaxial pattern 160B may not include an inclined surface (e.g., the first inclined surface 160U2 or the second inclined surface 160U3 in FIG. 2). In an embodiment of the present disclosure, the second epitaxial pattern 160B may be an elevated source/drain area. That is, a vertical level of the top surface 160U of the second epitaxial pattern 160B may be higher than a vertical level of the topmost surface of the second active pattern 110B. For example, the vertical level of the top surface 160U of the second epitaxial pattern 160B may be higher than a vertical level of the top surface of the sixth sheet pattern 116.

Figure 10:
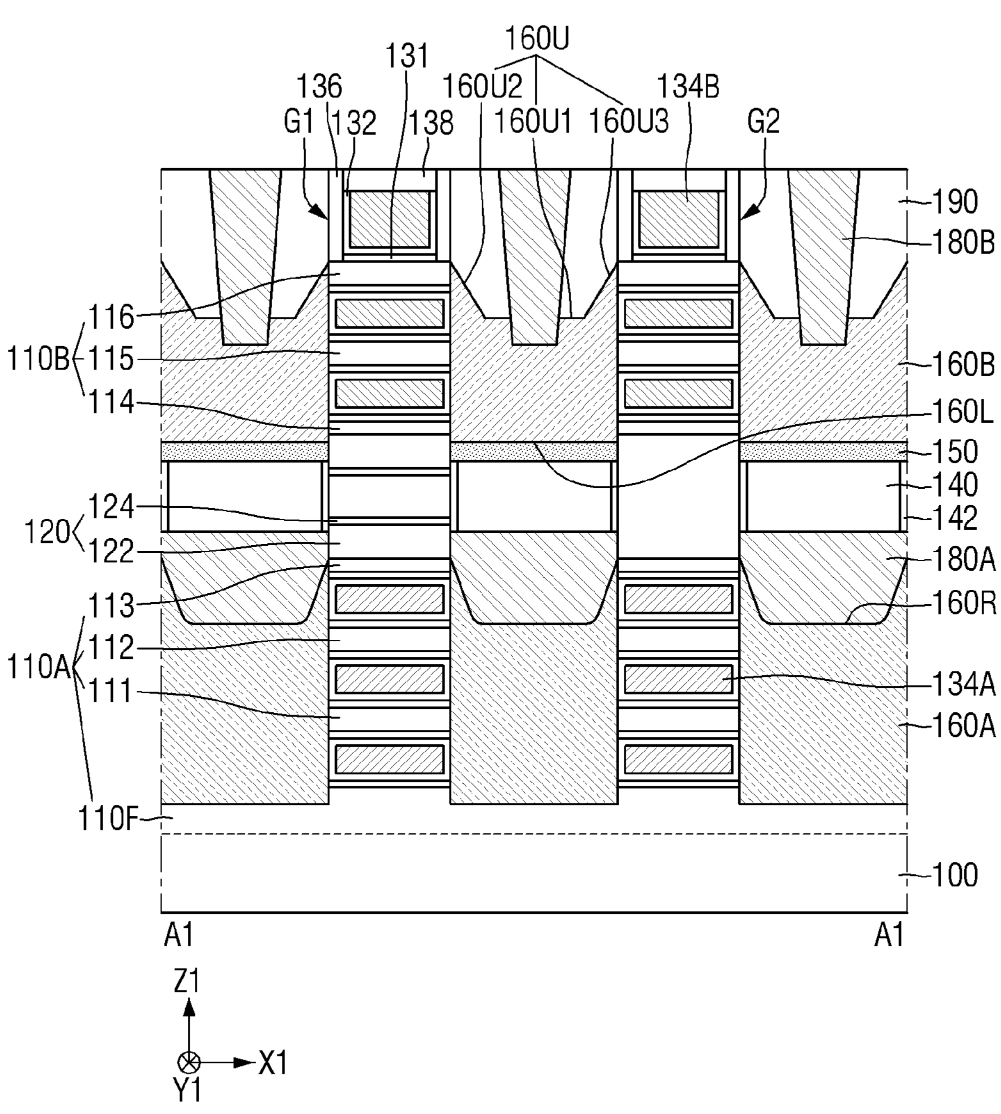

Referring to FIG. 10, in a semiconductor device according to an embodiment of the present disclosure, an isolation pattern 120 is embodied as a multilayer.

The isolation pattern 120 may include first insulating films 122 and second insulating films 124 alternately stacked on top of each other while being disposed on the first active pattern 110A. Each of the first insulating film 122 and the second insulating film 124 may include an insulating material, for example, at least one of silicon oxide ($SiO_2$), silicon nitride ($Si_3N_4$), silicon oxynitride (SiON), or a combination thereof. However, the present disclosure is not limited thereto. The first insulating film 122 and the second insulating film 124 may include different materials. In an embodiment of the present disclosure, the first insulating film 122 may include silicon nitride ($Si_3N_4$), and the second insulating film 124 may include silicon oxide ($SiO_2$).

Figure 11:
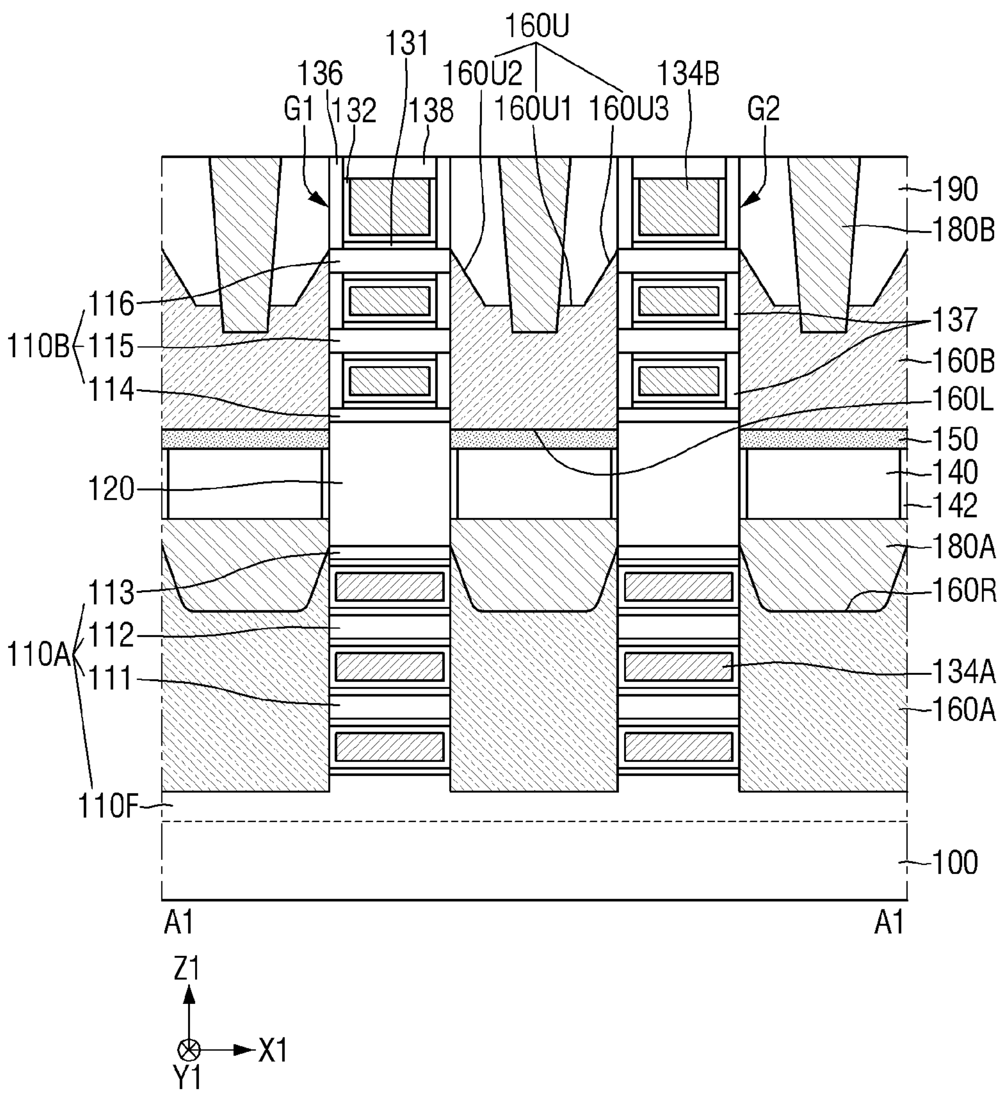

Referring to FIG. 11, in a semiconductor device according to an embodiment of the present disclosure, each of the first and second gate structures G1 and G2 further includes an inner spacer 137.

The inner spacer 137 may be formed on a side surface of each of the gate electrodes 134A and 134B interposed between the sheet patterns (e.g., the first to sixth sheet patterns 111 to 116). In FIG. 11, it is illustrated that the inner spacer 137 is formed only on the side surface of the upper gate electrode 134B between the upper sheet patterns (e.g., the fourth to sixth sheet patterns 114 to 116). However, this is only an example. In another example, the inner spacer 137 may be formed on the side surface of the lower gate electrode 134A between the lower sheet patterns (for example, the first to third sheet patterns 111 to 113).

In an embodiment of the present disclosure, the inner spacer 137 may be formed on the side surface of each of the gate electrodes 134A and 134B of the PFET. In one example, the first active pattern 110A may be used as a channel area of the PFET, and the second active pattern 110B may be used as a channel area of the NFET. In this case, as shown, the inner spacer 137 may be formed on the side surface of the upper gate electrode 134B between the upper sheet patterns (e.g., the fourth to sixth sheet patterns 114 to 116), and may not be formed on the side surface of the lower gate electrode 134A between the lower sheet patterns (e.g., the first to third sheet patterns 111 to 113). The inner spacers 137 may be formed of or include at least one of, for example, silicon oxide ($SiO_2$), silicon nitride ($Si_3N_4$), silicon carbide (SiC), silicon oxycarbide (SiOC), or aluminum oxide ($Al_2O_3$).

Figure 12:
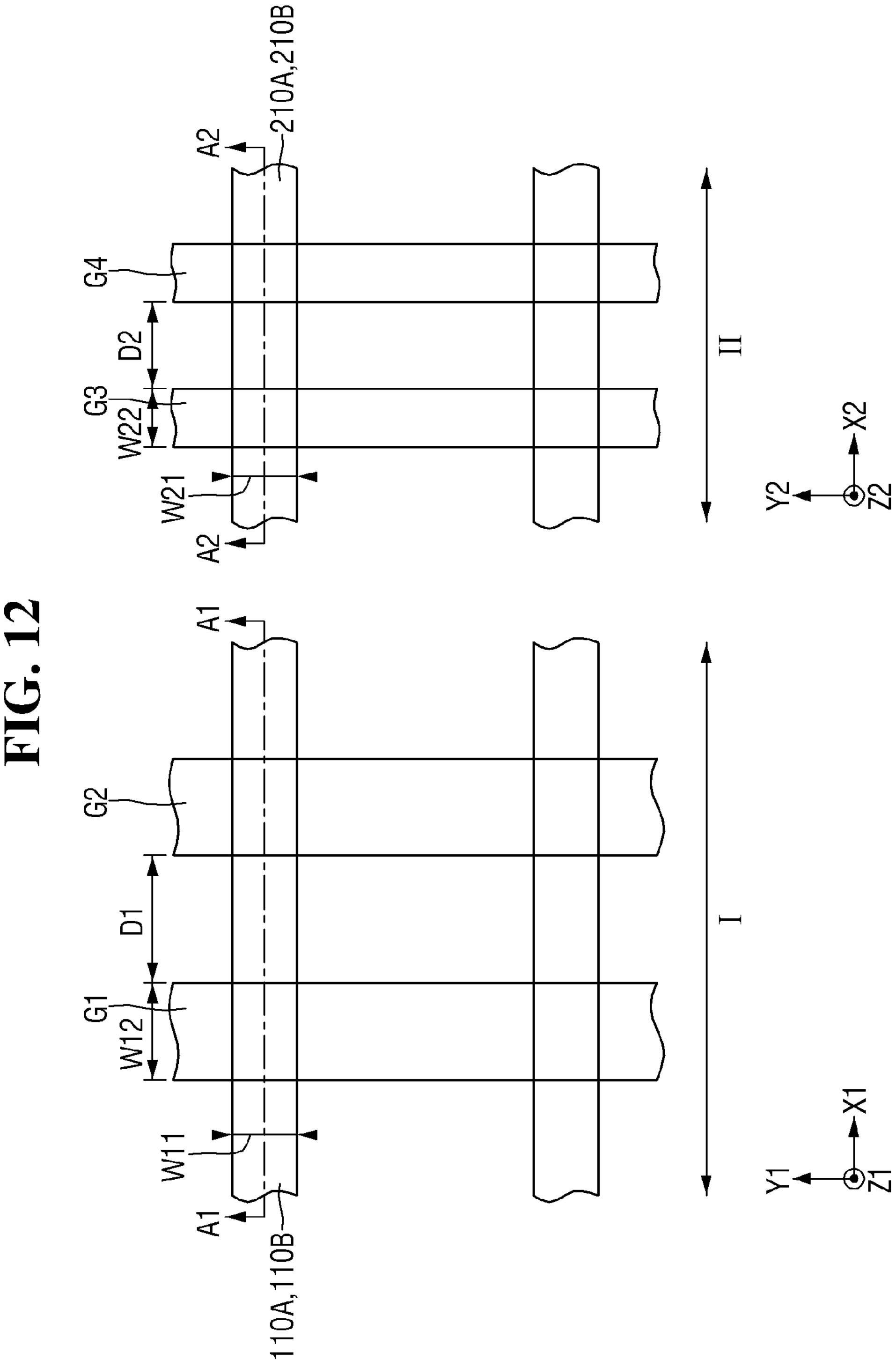
FIG. 12 is a schematic layout diagram for illustrating a semiconductor device according to an embodiment of the present disclosure.
Figure 13:
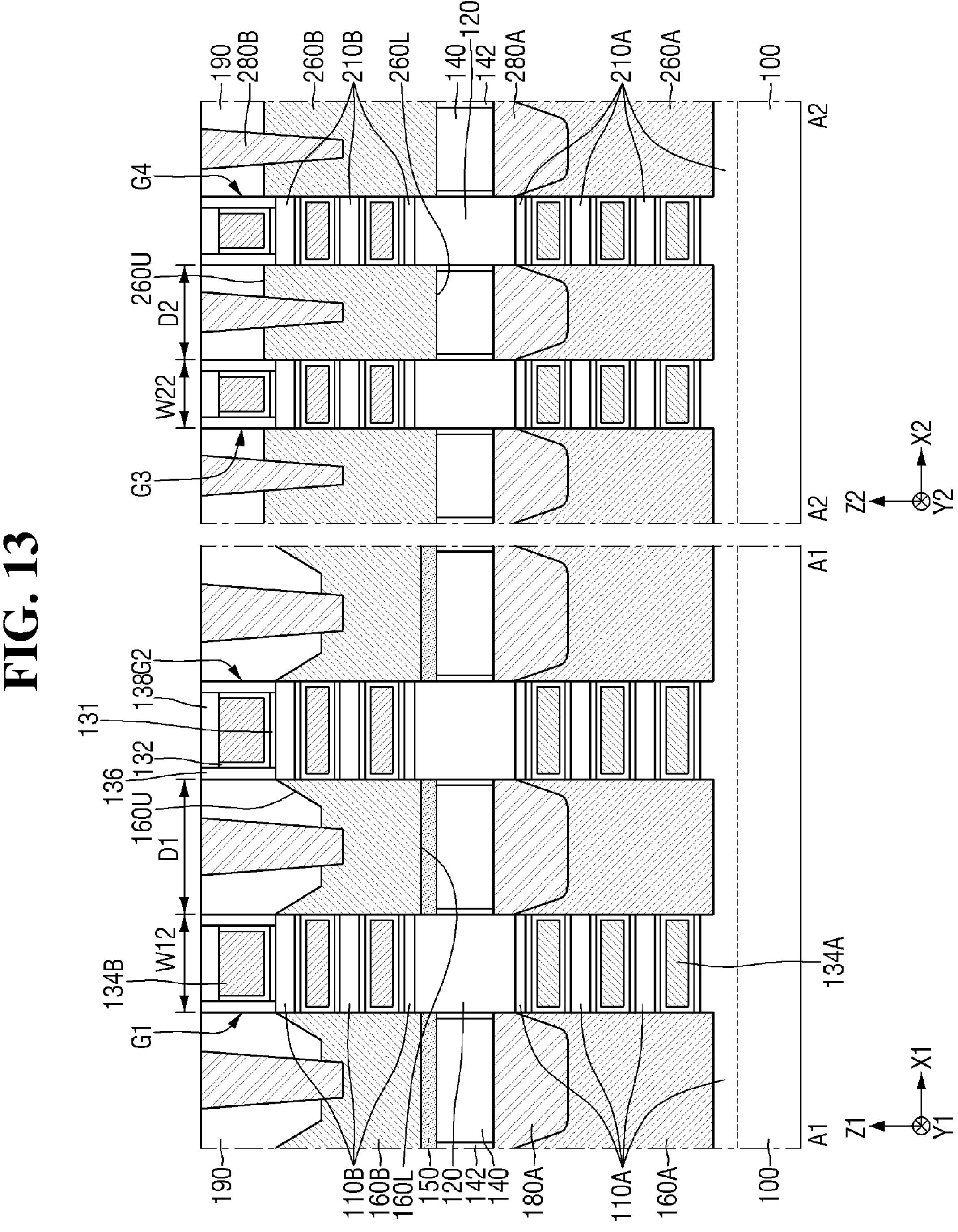
FIG. 13 is a cross-sectional view taken along A1-A1 and A2-A2 of FIG. 12.

FIG. 12 is a schematic layout diagram for illustrating a semiconductor device according to an embodiment of the present disclosure. FIG. 13 is a cross-sectional view taken along A1-A1 and A2-A2 of FIG. 12. For the convenience of description, those duplicate with the descriptions as set forth above with reference to FIG. 1 to FIG. 11 are briefly described or omitted.

Referring to FIGS. 12 and 13, in a semiconductor device according to an embodiment of the present disclosure, the substrate 100 includes a first area I and a second area II.

The first area I and the second area II may be spaced apart from each other or may be connected to each other. In an embodiment of the present disclosure, the first area I may have a lower integration level than that of the second area II. In one example, the first area I may act as an input/output (I/O) area, while the second area II may act as a logic area or an SRAM (static RAM) area. In another example, the first area I may act as an EGFET (extra gate FET) area of a logic element, while the second area II may act as an SGFET (single gate FET) area of the logic element. The extra gate FET may have a multi-gate structure.

The first active pattern 110A, the second active pattern 110B, the first gate structure G1, the second gate structure G2, the first epitaxial pattern 160A, the second epitaxial pattern 160B, the semiconductor film 150, the first source/drain contact 180A and the second source/drain contact 180B may be formed on the first area I of the substrate 100.

A third active pattern 210A, a fourth active pattern 210B, a third gate structure G3, a fourth gate structure G4, a third epitaxial pattern 260A, a fourth epitaxial pattern 260B, a third source/drain contact 280A and a fourth source/drain contact 280B may be formed on the second area II of the substrate 100.

The third active pattern 210A and the fourth active pattern 210B may be sequentially disposed on the substrate 100. The third active pattern 210A may be directly disposed on the substrate 100. The fourth active pattern 210B may be separated from the third active pattern 210A while being disposed on the third active pattern 210A. Each of the third active pattern 210A and the fourth active pattern 210B may extend in a fourth direction X2 parallel to the top surface of the substrate 100. Further, the third active pattern 210A and the fourth active pattern 210B may overlap each other in a direction (for example, in a sixth direction Z2) intersecting the top surface of the substrate 100. Since the third active pattern 210A and the fourth active pattern 210B may be similar to the first active pattern 110A and the second active pattern 110B, respectively, a detailed description thereof is omitted.

In an embodiment of the present disclosure, a width W11 of each of the first and second active patterns 110A and 110B may be equal to a width W21 of each of the third and fourth active patterns 210A and 210B. As used herein, "A is equal to B" may mean not only that A is exactly equal to B, but also that A is different from B by a minute difference that may occur due to a process margin. In an embodiment of the present disclosure, the width W11 of each of the first and second active patterns 110A and 110B may be different from the width W21 of each of the third and fourth active patterns 210A and 210B.

Each of the third gate structure G3 and the fourth gate structure G4 may extend in a fifth direction Y2 that is parallel to the top surface of the substrate 100 and intersects the fourth direction X2. Further, the third gate structure G3 and the fourth gate structure G4 may extend in a parallel manner to each other and may be spaced apart from each other in the fourth direction X2. Since the third gate structure G3 and the fourth gate structure G4 may be similar to the first gate structure G1 and the second gate structure G2, respectively, a detailed description thereof is omitted.

In an embodiment of the present disclosure, a channel length of each of the first and second active patterns 110A and 110B may be greater than a channel length of each of the third and fourth active patterns 210A and 210B. For example, a width W12 of each of the first and second gate structures G1 and G2 may be greater than a width W22 of each of the third and fourth gate structures G3 and G4.

In an embodiment of the present disclosure, a spacing D1 between the first and second gate structures G1 and G2 may be greater than a spacing D2 between the third and fourth gate structures G3 and G4. For example, the spacing D1 between the first and second gate structures G1 and G2 may be greater than or equal to about 15 nm, while the spacing D2 between the third and fourth gate structures G3 and G4 may be smaller than about 15 nm. In one example, the spacing D1 between the first and second gate structures G1 and G2 may be in a range of about 15 nm inclusive to about 30 nm inclusive, while the spacing D2 between the third and fourth gate structures G3 and G4 may be in range of about 5 nm to about 15 nm exclusive. For example, the spacing D2 between the third and fourth gate structures G3 and G4 may be larger than about 5 nm and smaller than about 15 nm.

The third epitaxial pattern 260A may be formed on the top surface of the substrate 100 and a side surface of each of the third and fourth gate structures G3 and G4. The third epitaxial pattern 260A may be connected to the third active pattern 210A. The third epitaxial pattern 260A may act as a source/drain area of a field effect transistor including the third active pattern 210A and the third and fourth gate structures G3 and G4. The third active pattern 210A may be used as a channel area of the field effect transistor.

The third epitaxial pattern 260A may include an epitaxial layer grown using the substrate 100 and the third active pattern 210A as a seed layer or seed layers. For example, the third epitaxial pattern 260A may be an epitaxial layer grown from the top surface of the substrate 100 and the side surface of the third active pattern 210A using an epitaxial growth scheme. Since the third epitaxial pattern 260A may be similar to the first epitaxial pattern 160A, a detailed description thereof is omitted below.

The fourth epitaxial pattern 260B may be formed on a top surface of the third epitaxial pattern 260A and a side surface of each of the third and fourth gate structures G3 and G4. The fourth epitaxial pattern 260B may be connected to the fourth active pattern 210B. The fourth epitaxial pattern 260B may act as a source/drain area of a field effect transistor including the fourth active pattern 210B and the third and fourth gate structures G3 and G4. The fourth active pattern 210B may be used as a channel area of the field effect transistor.

In an embodiment of the present disclosure, the semiconductor film 150 may be formed on the first area I and may not be formed on the second area II. For example, the semiconductor film 150 may be interposed between the insulating pattern 140 and the second epitaxial pattern 160B, and may not be interposed between the insulating pattern 140 and the fourth epitaxial pattern 260B. Thus, a bottom surface 260L of the fourth epitaxial pattern 260B may directly contact the top surface of the insulating pattern 140.

The fourth epitaxial pattern 260B may include an epitaxial layer grown using the fourth active pattern 210B as a seed layer. For example, the fourth epitaxial pattern 260B may be an epitaxial layer grown from a side surface of the second active pattern 110B using an epitaxial growth scheme.

In an embodiment of the present disclosure, the fourth epitaxial pattern 260B may be formed in a merged manner as the third epitaxial pattern 260A may. For example, as the spacing D2 between the third and fourth gate structures G3 and G4 is decreased (for example, to a value smaller than about 15 nm), the fourth epitaxial pattern 260B may be formed in a merged manner. A vertical level of the top surface 260U of the fourth epitaxial pattern 260B may be higher than a vertical level of the topmost surface of the fourth active pattern 210B.

The third source/drain contact 280A may be electrically connected to the third epitaxial pattern 260A. For example, the third source/drain contact 280A may be interposed between the third epitaxial pattern 260A and the insulating pattern 140, and may contact a top surface of the third epitaxial pattern 260A. Since the third source/drain contact 280A may be similar to the first source/drain contact 180A, a detailed description thereof is omitted below.

The fourth source/drain contact 280B may be electrically connected to the fourth epitaxial pattern 260B. For example, the fourth source/drain contact 280B may pass through the interlayer insulating film 190 in the sixth direction Z2 and may contact a top surface of the fourth epitaxial pattern 260B. Since the fourth source/drain contact 280B may be similar to the second source/drain contact 180B, a detailed description thereof is omitted below.

An epitaxial pattern of the upper multi-gate transistor may be formed in an unmerged manner as a distance between the gate structures thereof increases (to, for example, a value equal to or larger than about 15 nm). However, the semiconductor device according to an embodiment of the present disclosure includes the semiconductor film 150 selectively formed in an area (e.g., the first area I) where the distance between the gate structures is large, thereby effectively preventing formation of the unmerged epitaxial pattern.

Hereinafter, with reference to FIG. 1 to FIG. 32, a method for manufacturing a semiconductor device according to an embodiment of the present disclosure is described.

FIG. 14 to FIG. 30 are diagrams of intermediate structures corresponding to intermediate steps for illustrating a method for manufacturing a semiconductor device according to an embodiment of the present disclosure. For the convenience of description, those duplicate with the descriptions as set forth above with reference to FIG. 1 to FIG. 13 are briefly described or omitted.

Figure 14:
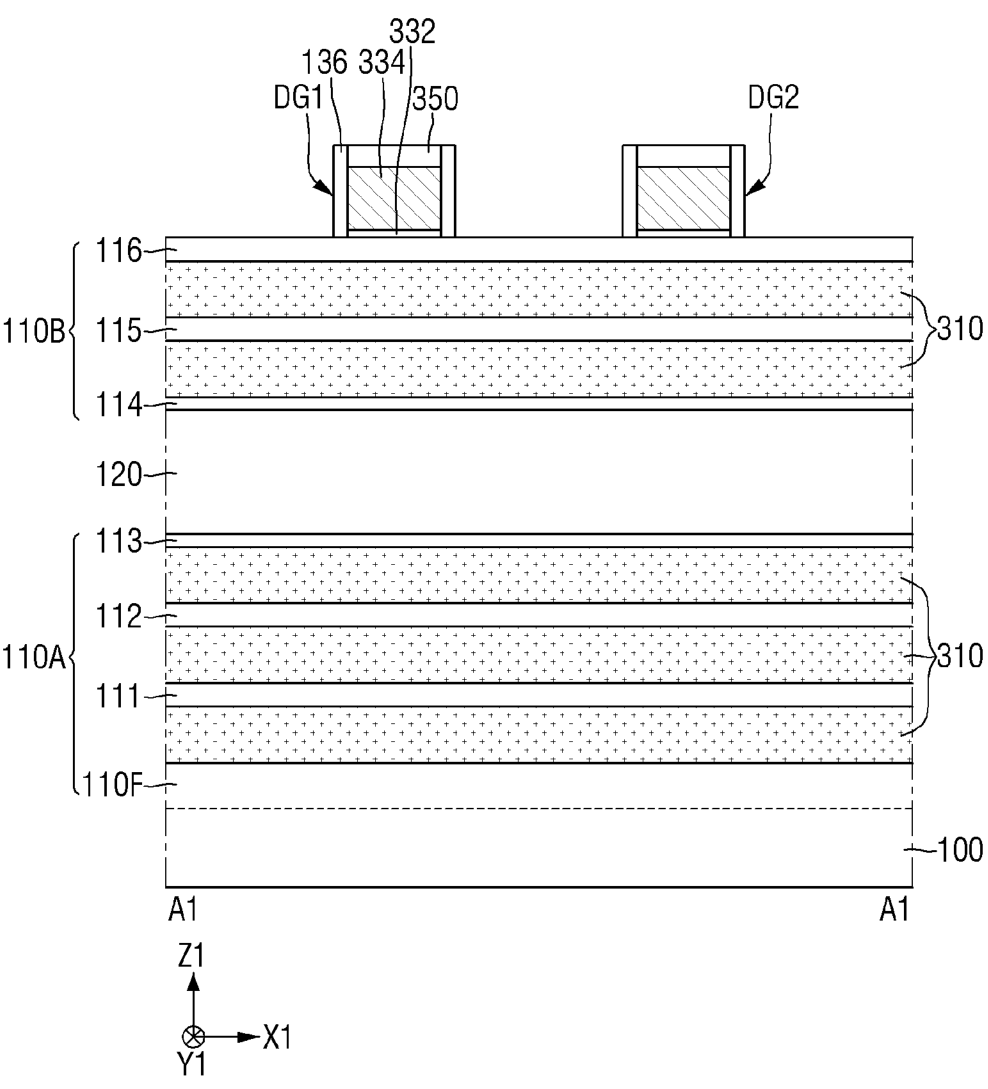
FIG. 14 to FIG. 30 are diagrams of intermediate structures corresponding to intermediate steps for illustrating a method for manufacturing a semiconductor device according to an embodiment of the present disclosure.

Referring to FIG. 14, the plurality of sheet patterns 111 to 116, a plurality of sacrificial patterns 310, and dummy gate structures DG1 and DG2 are formed on the substrate 100.

First material films and second material films alternately stacked on top of each other while being disposed on the substrate 100 may be formed. Subsequently, a mask pattern extending in the first direction X1 may be formed on the first material film and the second material film. Then, a patterning process of patterning the first material film and the second material film using the mask pattern as an etching mask may be performed. The patterning process may include an etch process such as, for example, a reactive ion etching (RIE) process. The patterned second material films may respectively constitute the sheet patterns 111 to 116. The patterned first material films may respectively constitute the sacrificial patterns 310. The sacrificial patterns 310 may extend in parallel with each other in the first direction X1, and may be arranged and spaced apart from each other in the third direction Z1.

In an embodiment of the present disclosure, each of the sheet patterns 111 to 116 and each of the sacrificial patterns 310 may have different etch selectivity from each other. In one example, each of the sheet patterns 111 to 116 may include silicon (Si), and each of the sacrificial patterns 310 may include silicon germanium (SiGe).

In an embodiment of the present disclosure, in a process of patterning the first material films and the second material films, a portion of the substrate 100 may be etched to form the fin pattern 110F.

Subsequently, the dummy gate structures DG1 and DG2 may be formed. The dummy gate structures DG1 and DG2 may intersect the sheet patterns 111 to 116 and the sacrificial patterns 310. For example, the dummy gate structures DG1 and DG2 may extend in the second direction Y1. Each of the sheet patterns 111 to 116 and the sacrificial patterns 310 may extend in the first direction X1 and pass through the dummy gate structures DG1 and DG2.

Each of the dummy gate structures DG1 and DG2 may include, for example, a dummy gate dielectric film 332, a dummy gate electrode 334, and the gate spacer 136 sequentially stacked. The dummy gate dielectric film 332 and the dummy gate electrode 334 may be formed by a patterning process using a mask pattern 350 as an etching mask. For example, a dielectric film and an electrode film sequentially stacked on the substrate 100 may be formed. Subsequently, the mask pattern 350 extending in the second direction Y1 may be formed on the electrode film. Subsequently, a patterning process of patterning the dielectric film and the electrode film using the mask pattern 350 as an etching mask may be performed. The patterned dielectric film may constitute the dummy gate dielectric film 332, and the patterned electrode film may constitute the dummy gate electrode 334. The gate spacer 136 may extend along a side surface of the dummy gate electrode 334. A pair of the gate spacers 136 may be formed on both side surfaces of each of the dummy gate electrode 334 and the mask pattern 350. The formation of the gate spacers 136 may include conformally forming a spacer layer on the substrate 100 and anisotropically etching the spacer layer. To form the gate spacers 136, a process such as, for example, an atomic layer deposition (ALD) process, a chemical vapor deposition (CVD) process, or a combination thereof may be used.

The dummy gate electrode 334 may include a material having an etching selectivity different from that of each of the sheet patterns 111 to 116 and the sacrificial patterns 310. In an embodiment of the present disclosure, the dummy gate electrode 334 may include polysilicon (p-Si).

Figure 15:
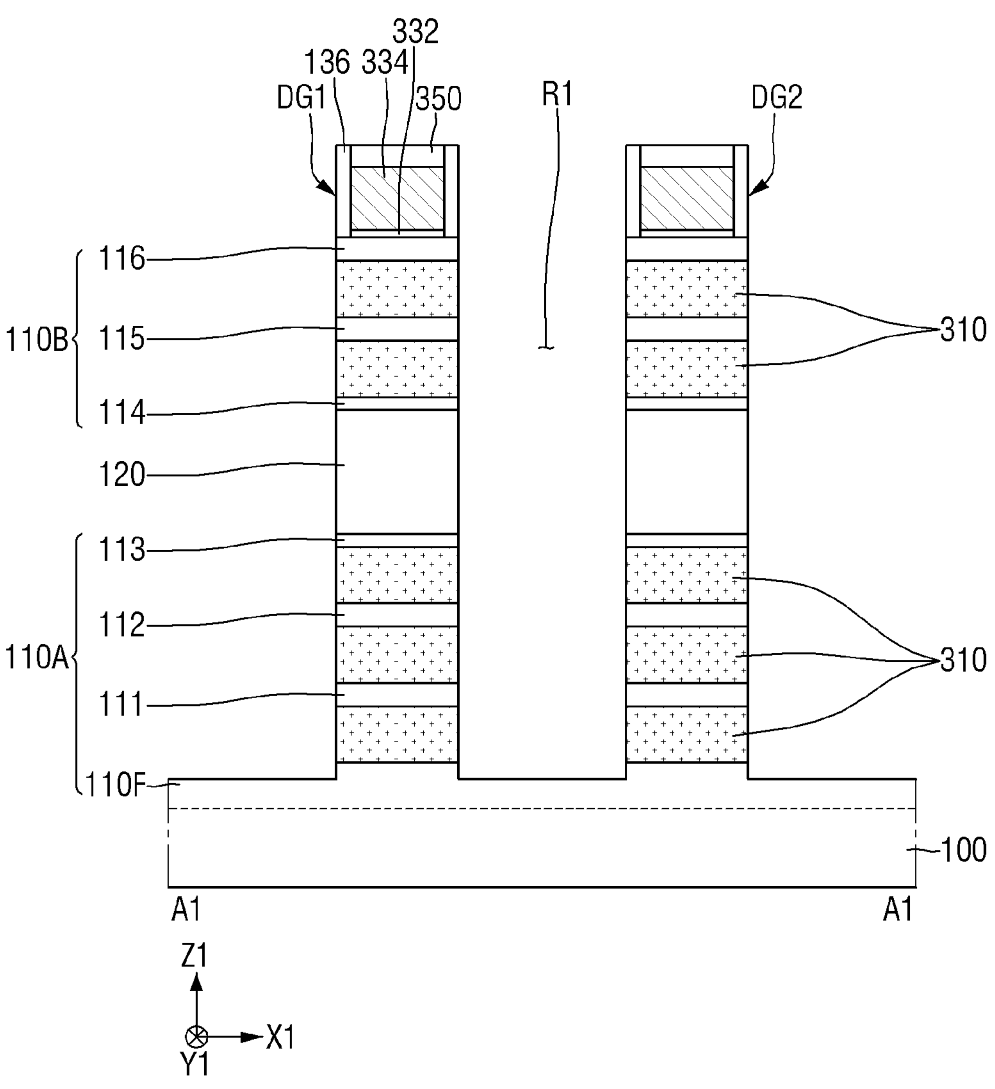

Referring to FIG. 15, a first recess process is performed on the sheet patterns 111 to 116 and the sacrificial patterns 310.

As the first recess process performed, a portion of each of the sheet patterns 111 to 116 and a portion of each of the sacrificial patterns 310 disposed outside the dummy gate structures DG1 and DG2 may be removed. Accordingly, a first recess R1 exposing a side surface of each of the sheet patterns 111 to 116 and a side surface of each of the sacrificial patterns 310 may be formed. The first recess process may be an anisotropical dry etching process. However, the present disclosure is not limited thereto.

Figure 16:
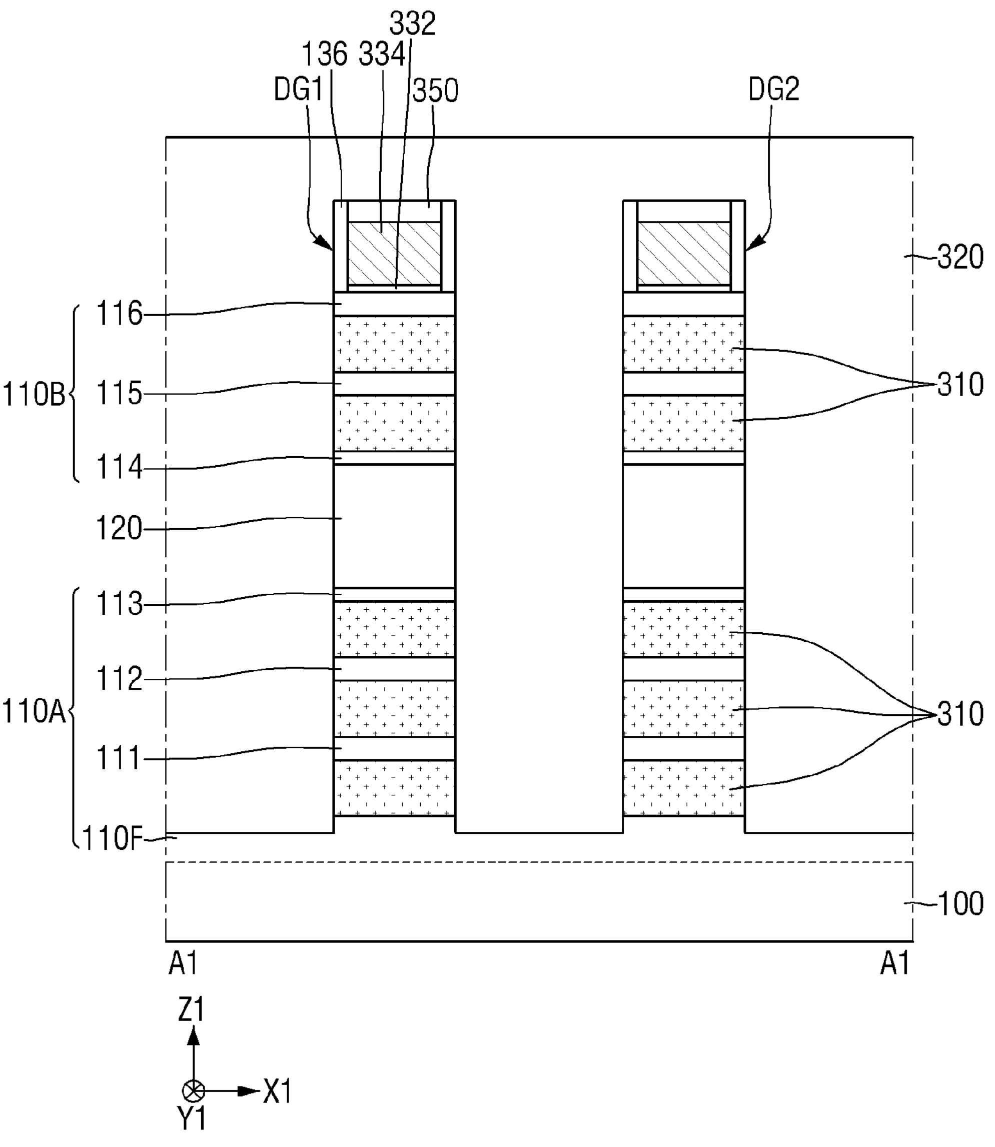

Referring to FIG. 16, a first filling sacrificial film 320 is formed.

The first filling sacrificial film 320 may be formed on a resulting structure of FIG. 15. Further, the first filling sacrificial film 320 may fill the first recess R1 in FIG. 15. The first filling sacrificial film 320 may include a material having an etching selectivity different from that of each of the sheet patterns 111 to 116 and the sacrificial patterns 310. In one example, the first filling sacrificial film 320 may include SOH (Spin-on Hardmask). For example, the first filling sacrificial film 320 may be formed through a spin coating process. However, the present disclosure is not limited thereto.

Figure 17:
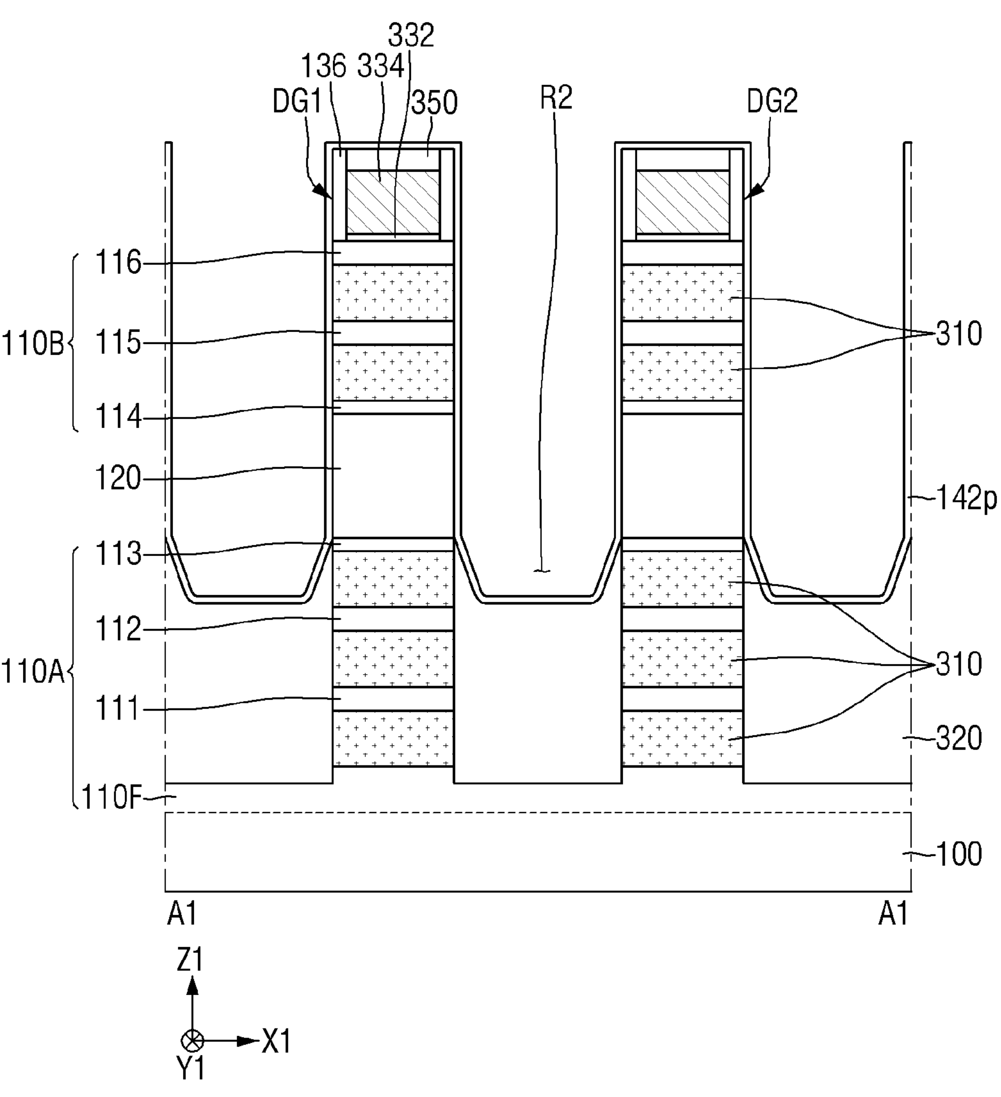

Referring to FIG. 17, a second recess process is performed on the first filling sacrificial film 320, and a pre-liner film 142*p* is formed.

As the second recess process is performed, a side surface of each of the upper sheet patterns 114 to 116 may be exposed. For example, an upper portion of the first filling sacrificial film 320 may be removed to form a second recess R2 exposing the side surface of each of the upper sheet patterns 114 to 116. After the second recess process has been performed, the first filling sacrificial film 320 may cover a side surface of each of the lower sheet patterns 111 to 113. For example, the second recess R2 may not expose the side surface of each of the lower sheet patterns 111 to 113.

The pre-liner film 142*p* may be stacked on the first filling sacrificial film 320 on which the second recess process has been performed. For example, the pre-liner film 142*p* may conformally extend along the second recess R2, the side surface of the isolation pattern 120, the side surface of the second active pattern 110B, and the side surface of each of the first and second gate structures G1 and G2.

Figure 18:
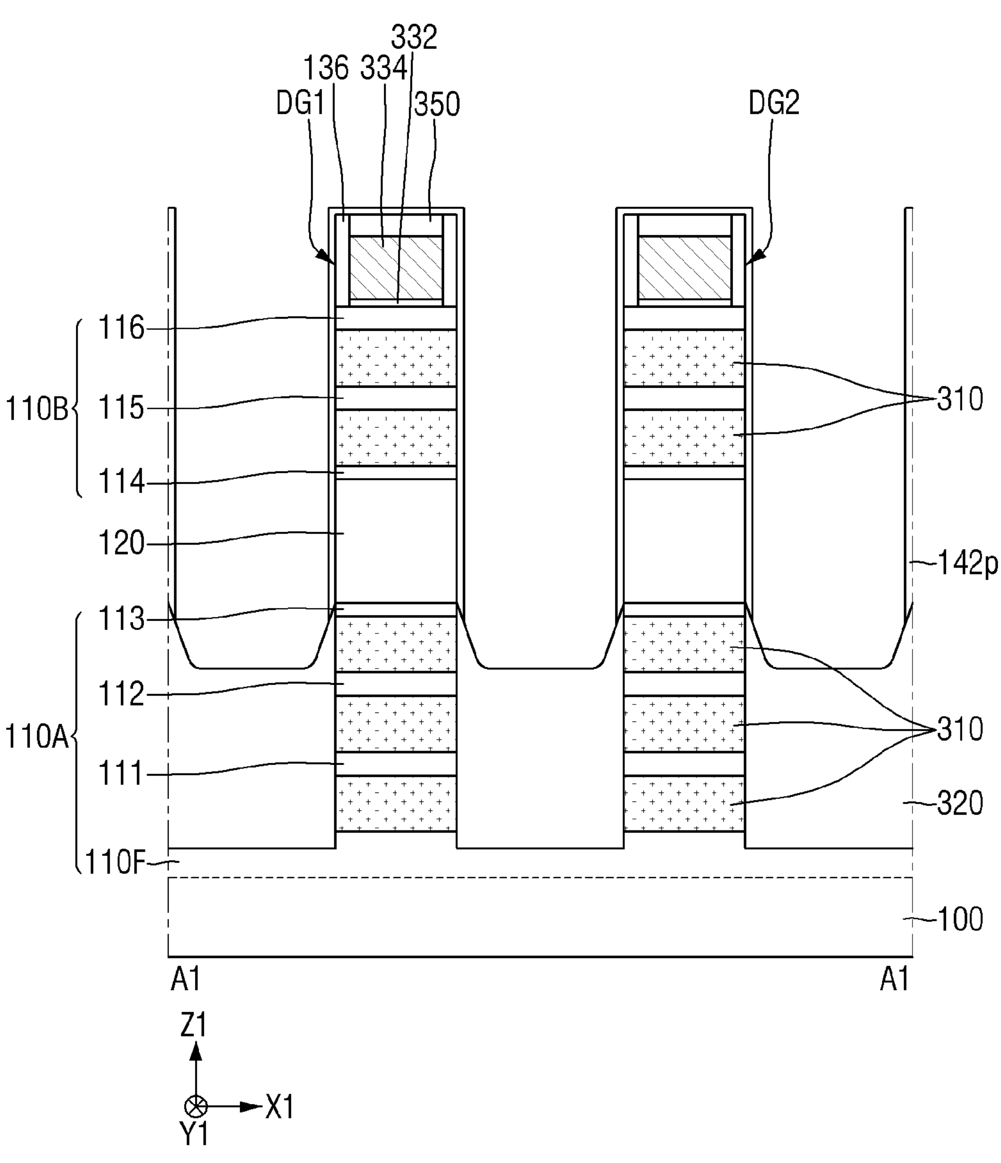

Referring to FIG. 18, a top surface of the first filling sacrificial film 320 is exposed.

A portion of the pre-liner film 142*p* extending along the top surface of the first filling sacrificial film 320 may be removed. The removing of the portion of the pre-liner film 142*p* may be performed using, for example, a dry etching process. However, the present disclosure is not limited thereto. Thus, the first filling sacrificial film 320 not covered with the pre-liner film 142*p* may be formed. Further, a remaining pre-liner film 142*p* may extend along the side surface of the isolation pattern 120, the side surface of the second active pattern 110B, and the side surface of each of the first and second gate structures G1 and G2.

Figure 19:
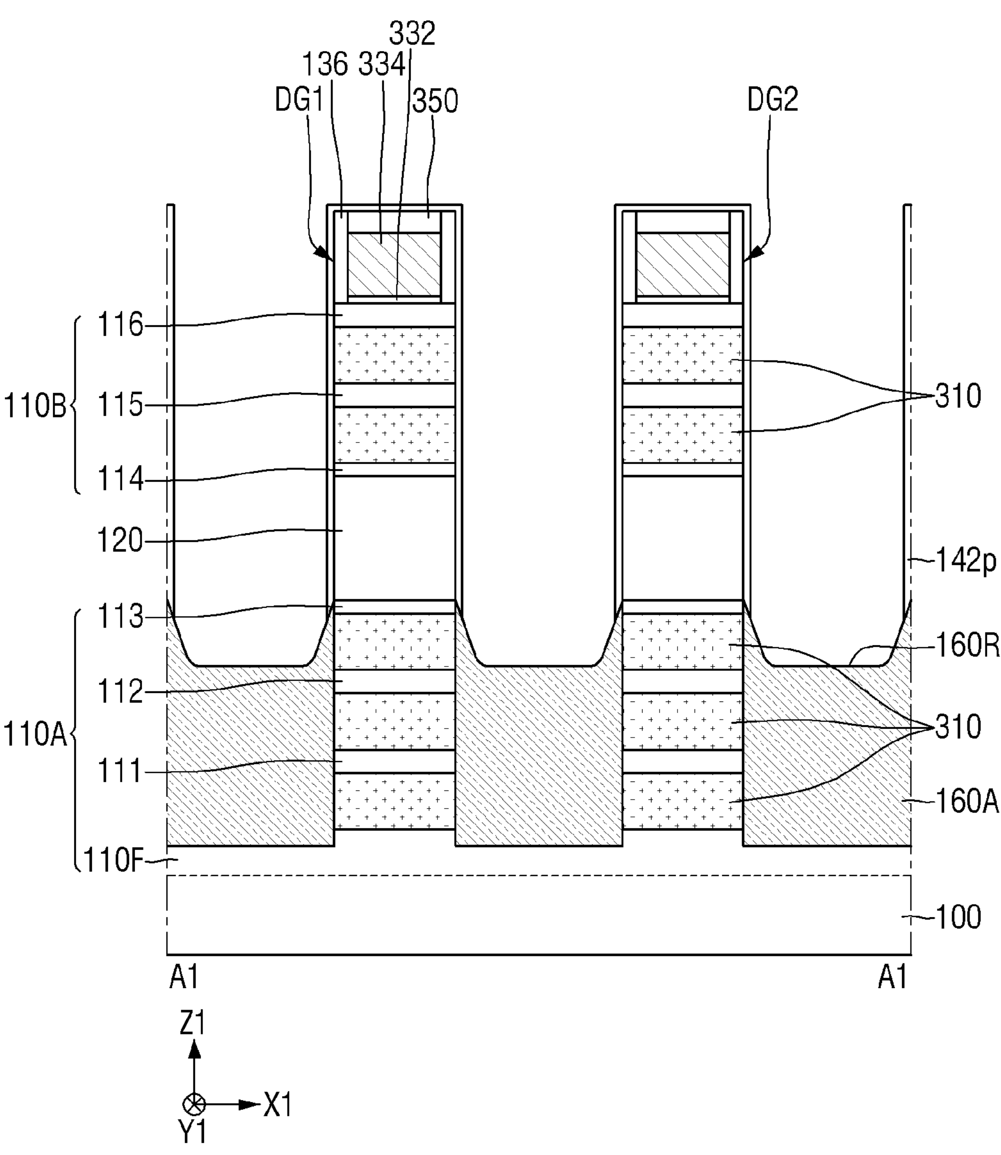

Referring to FIG. 19, the first filling sacrificial film 320 is replaced such that the first epitaxial pattern 160A is formed.

The first filling sacrificial film 320 not covered with the pre-liner film 142*p* may be removed. The removing of the first filling sacrificial film 320 may be performed by, for example, a wet etching process. However, the present disclosure is not limited thereto. As the first filling sacrificial film 320 is removed, the side surface of each of the lower sheet patterns 111 to 113, and the top surface of the substrate 100 (or the fin pattern 110F) may be exposed. Subsequently, the first epitaxial pattern 160A filling a space obtained via the removal of the first filling sacrificial film 320 may be formed. For example, an epitaxial growth process using the substrate 100 (or the fin pattern 110F) and the first active pattern 110A as the seed layer may be performed. In an embodiment of the present disclosure, the first epitaxial pattern 160A may be formed by a selective epitaxial growth (SEG) process. As an example, the SEG process may include a chemical vapor deposition (CVD) process or a molecular beam epitaxy (MBE) process. Since the second active pattern 110B may be protected with the pre-liner film 142*p*, the second active pattern 110B may not be used as a seed layer in the epitaxial growth process. Thus, the first epitaxial pattern 160A connected to the first active pattern 110A may be formed. As described above, as the first epitaxial pattern 160A is grown from the three surfaces, the first epitaxial pattern 160A may be formed in a merged manner.

Figure 20:
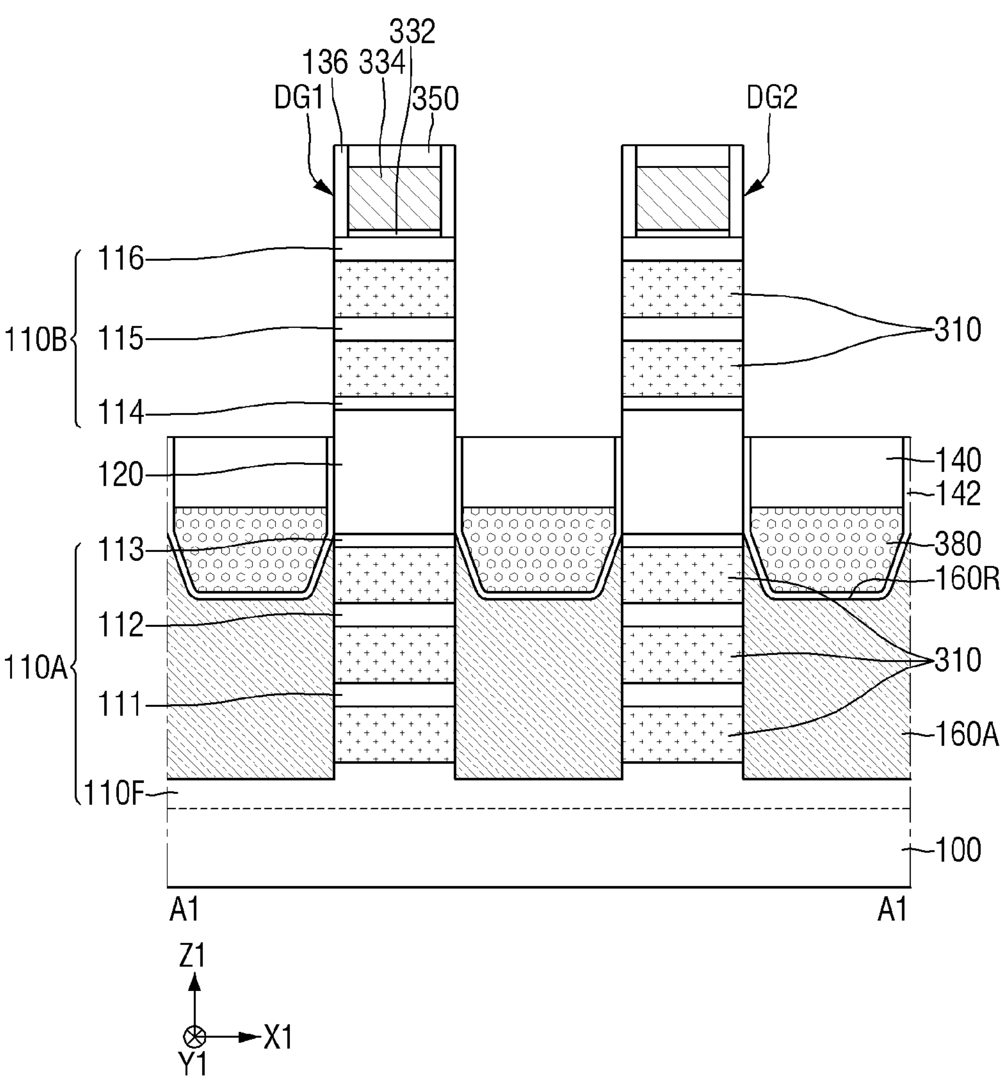

Referring to FIG. 20, the liner film 142, a sacrificial contact pattern 380, and the insulating pattern 140 are formed on the first epitaxial pattern 160A.

The pre-liner film (142*p* of FIG. 19) may be removed. Subsequently, the liner film 142, the sacrificial contact pattern 380, and the insulating pattern 140 may be sequentially stacked. For example, the liner film 142 may conformally extend along the top surface of the first epitaxial pattern 160A, the side surface of the isolation pattern 120, the side surface of the second active pattern 110B, and the side surface of each of the first and second gate structures G1 and G2. The sacrificial contact pattern 380 may fill a portion of an area on the liner film 142, while the insulating pattern 140 may fill a space defined by the sacrificial contact pattern 380.

Then, a third recess process on the liner film 142 and the insulating pattern 140 may be performed. As the third recess process is performed, the side surface of each of the upper sheet patterns 114 to 116 may be exposed. In an embodiment of the present disclosure, a vertical level of each of the top surface of the insulating pattern 140 and/or the top surface of the liner film 142 may be lower than a vertical level of the top surface of the isolation pattern 120.

Figure 21:
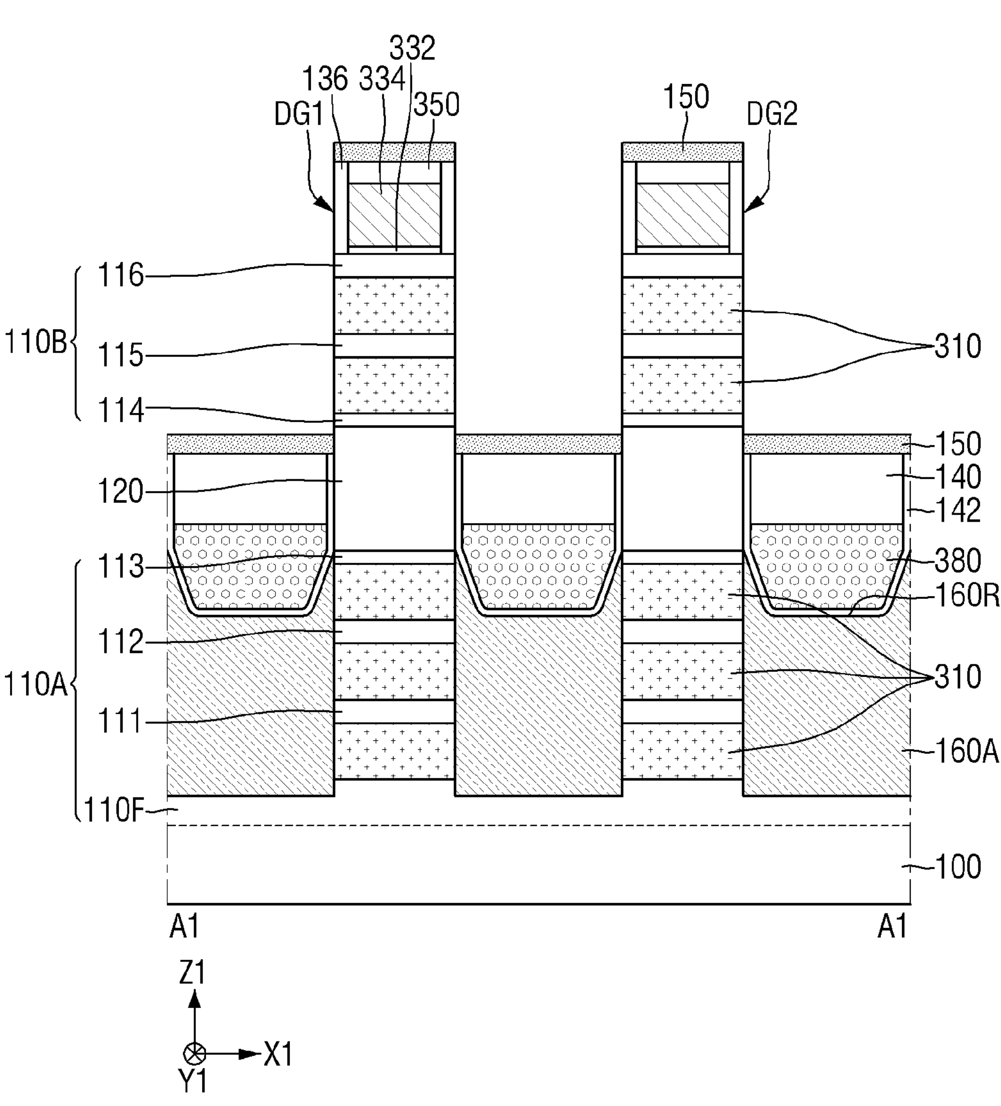

Referring to FIG. 21, the semiconductor film 150 is formed.

The semiconductor film 150 may be formed on the top surface of the insulating pattern 140 and/or the top surface of the liner film 142. For example, the semiconductor film 150 may conformally extend along the top surface of the insulating pattern 140 and the top surface of the liner film 142. In an embodiment of the present disclosure, the semiconductor film 150 may include a polycrystalline semiconductor material. For example, the semiconductor film 150 may include a polysilicon (p-Si) film.

In an embodiment of the present disclosure, the semiconductor film 150 may be formed by a directional deposition process. A directional deposition process is a deposition process in which the deposited material exits a source with directionality, e.g., along a vertical direction (e.g., third direction Z1) that is perpendicular to the top surface of the substrate 100. Exemplary directional deposition processes include physical vapor deposition and vacuum evaporation from an effusion cell or an e-beam source. As the directional deposition process is performed, the semiconductor film 150 may be selectively formed on a top surface of a resulting structure of FIG. 20. For example, the semiconductor film 150 may be selectively formed on the top surface of the insulating pattern 140, the top surface of the liner film 142, a top surface of the mask pattern 350, and a top surface of the gate spacer 136. Further, the semiconductor film 150 may not be formed on the side surface of the isolation pattern 120, the side surface of the second active pattern 110B, and the side surface of the sacrificial patterns 310.

Figure 22:
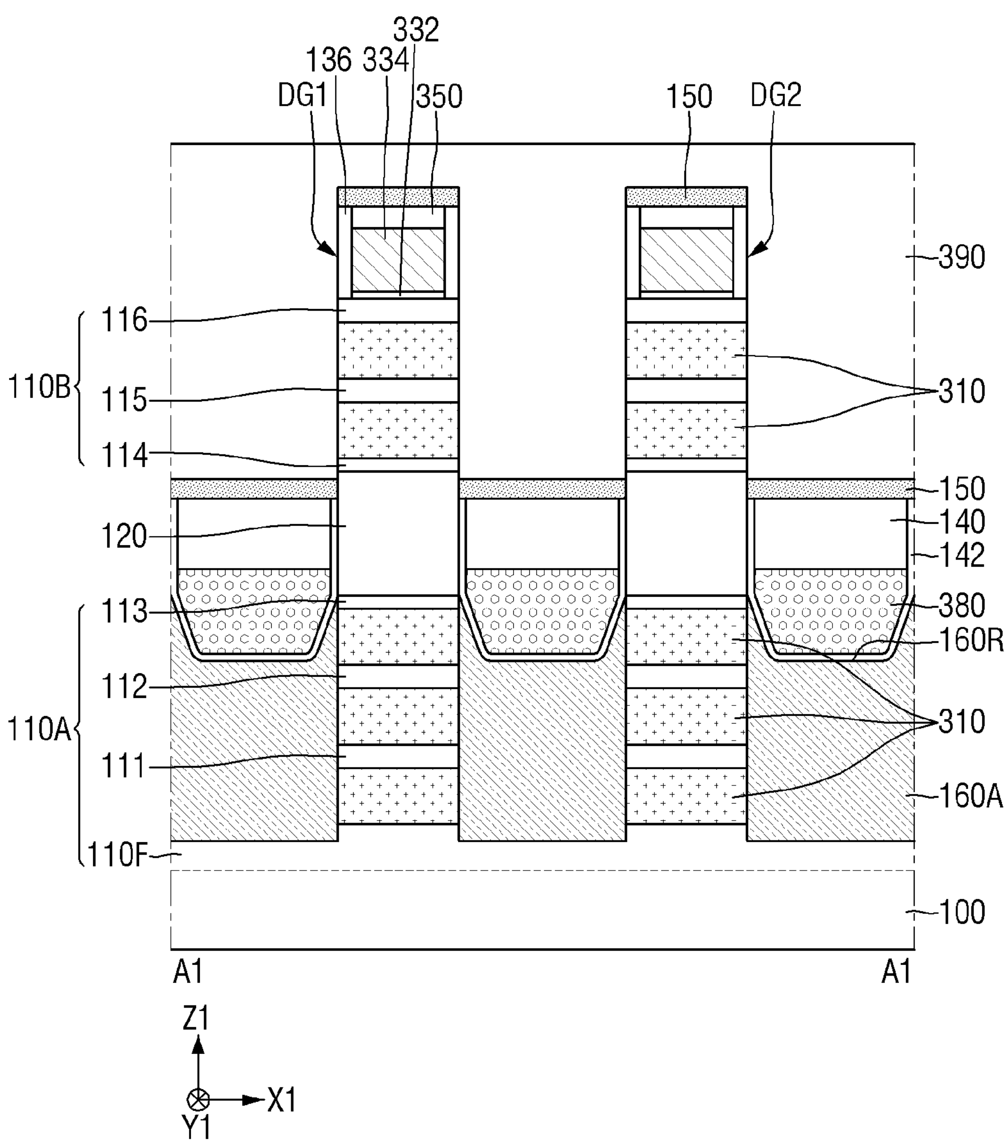

Referring to FIG. 22, a second filling sacrificial film 390 is formed.

The second filling sacrificial film 390 may be formed on a resulting structure of FIG. 21. The second filling sacrificial film 390 may include a material having an etch selectivity different from that of each of the sheet patterns 111 to 116, the sacrificial patterns 310, and the semiconductor film 150. For example, the second filling sacrificial film 390 may include SOH (Spin-on Hardmask). For example, the second filling sacrificial film 390 may be formed through a spin coating process. However, the present disclosure is not limited thereto.

Figure 23:
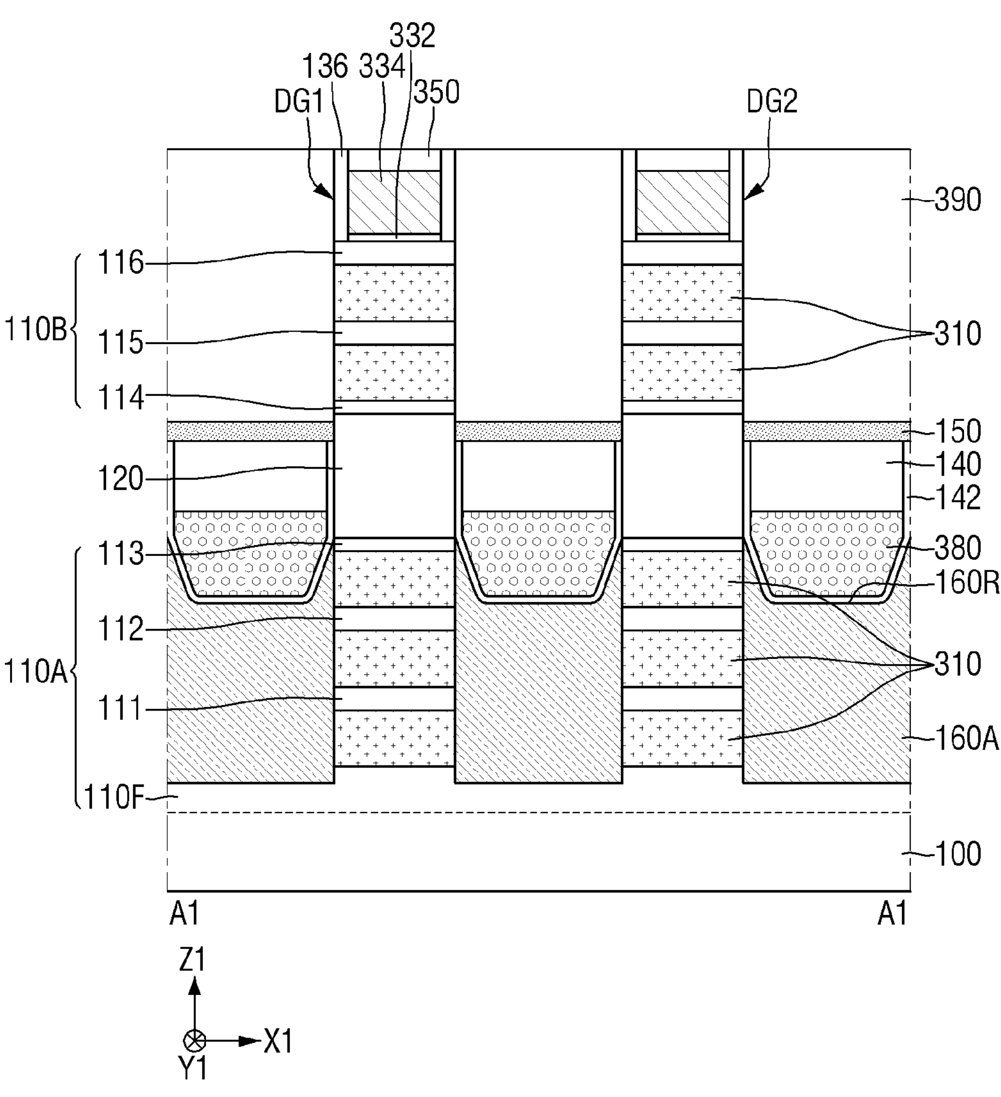

Referring to FIG. 23, a planarization process is performed.

As the planarization process is performed, a portion of the semiconductor film 150 on the top surface of the mask pattern 350 may be removed. For example, the planarization process may be performed using the top surface of the mask pattern 350 as an end point to remove an upper portion of the second filling sacrificial film 390 and an upper portion of the semiconductor film 150. The planarization process may include, for example, a chemical mechanical polishing (CMP) process. However, the present disclosure is not limited thereto.

Figure 24:
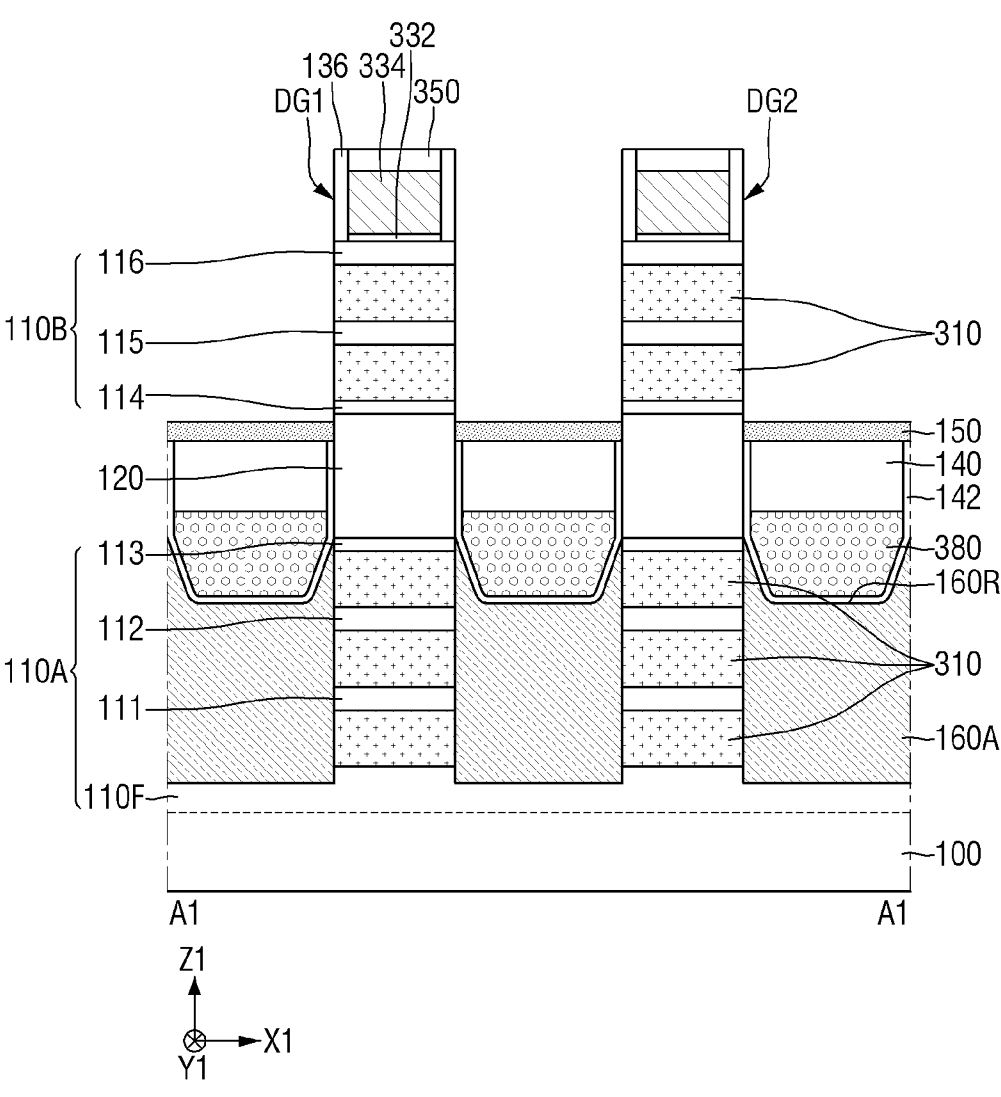

Referring to FIG. 24, the second filling sacrificial film 390 is selectively removed.

As the second filling sacrificial film 390 is removed, the side surfaces of the upper sheet patterns 114 to 116 and the top surface of the semiconductor film 150 may be exposed.

Figure 25:
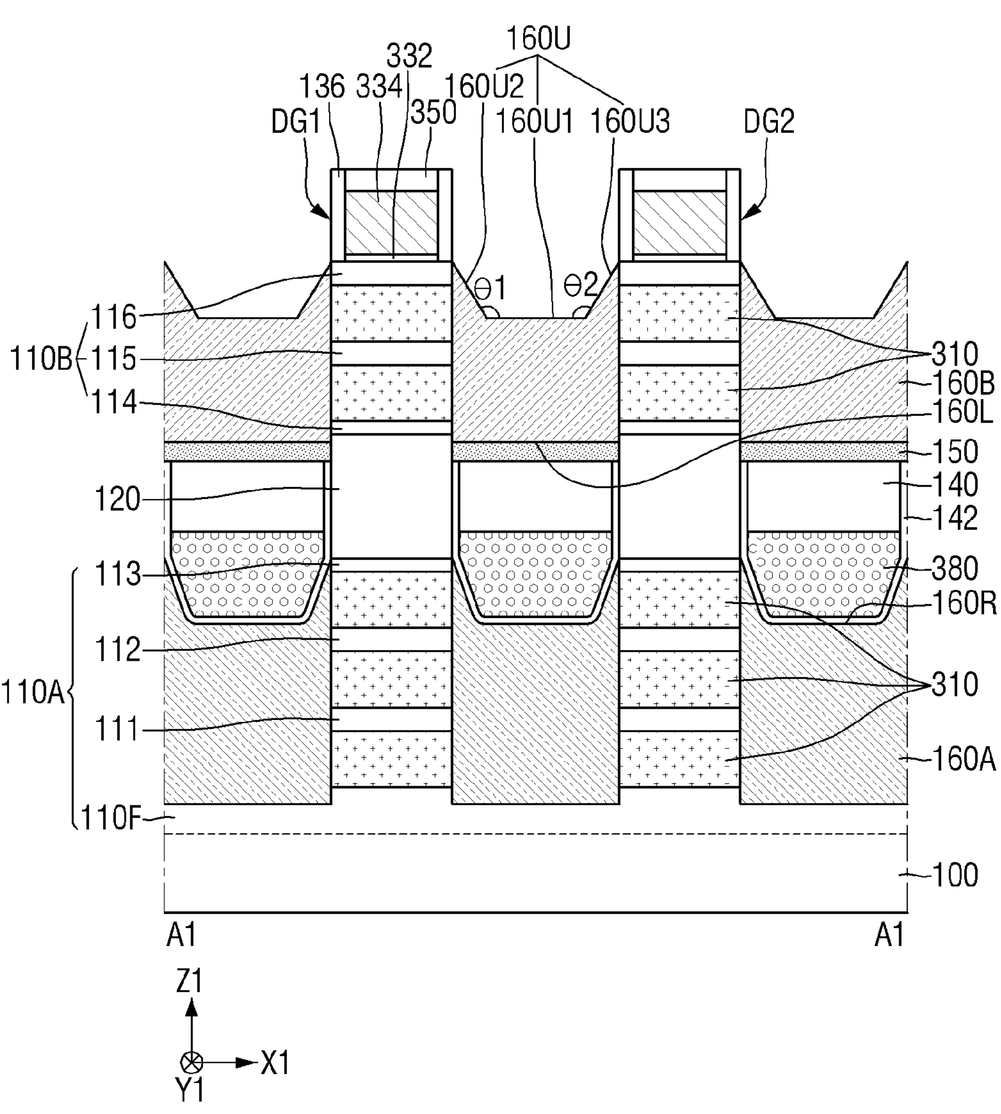

Referring to FIG. 25, the second epitaxial pattern 160B is formed.

An epitaxial growth process using the semiconductor film 150 and the second active pattern 110B as a seed layer or seed layers may be performed. Thus, the second epitaxial pattern 160B connected to the second active pattern 110B may be formed. In an embodiment of the present disclosure, the second epitaxial pattern 160B may be formed by a selective epitaxial growth (SEG) process. As an example, the SEG process may include a chemical vapor deposition (CVD) process or a molecular beam epitaxy (MBE) process. As described above, the second epitaxial pattern 160B may be grown from the three surfaces and thus may be formed in a merged manner as the first epitaxial pattern 160A may be.

Figure 26:
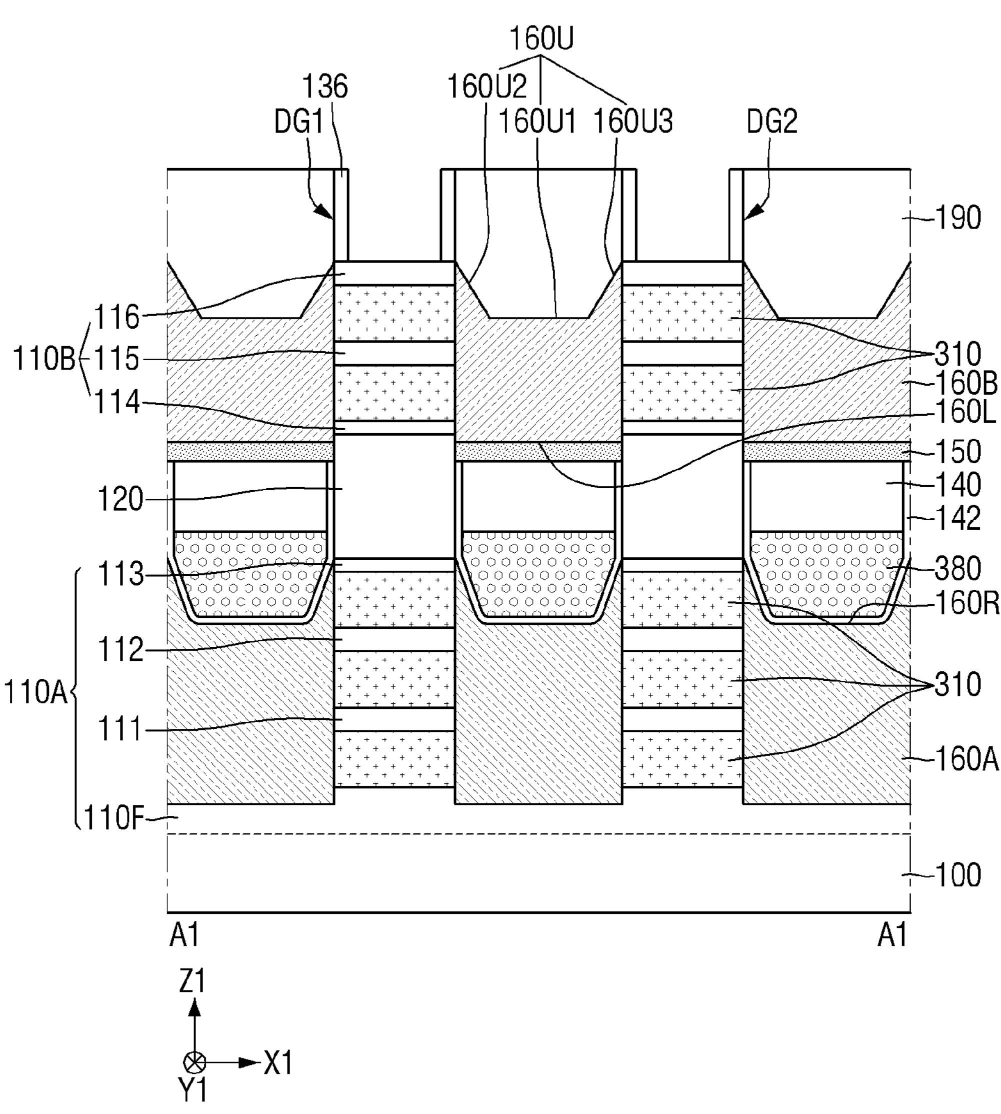

Referring to FIG. 26, the dummy gate dielectric film 332 and the dummy gate electrode 334 may be removed.

The interlayer insulating film 190 may be formed on the substrate 100. The interlayer insulating film 190 may be formed to fill a space on an outer side surface of the gate spacer 136. For example, the interlayer insulating film 190 may cover the outer side surface of the gate spacer 136 and the top surface of the second epitaxial pattern 160B. The interlayer insulating film 190 may be formed by a process such as, for example, a chemical vapor deposition (CVD) process, a sputtering process, a spin coating process, or an atomic layer deposition (ALD) process.

Next, the dummy gate dielectric film 332, the dummy gate electrode 334, and the mask pattern 350 not covered with the interlayer insulating film 190 and the gate spacer 136 may be removed. As the dummy gate dielectric film 332 and the dummy gate electrode 334 are removed, the sheet patterns 111 to 116 and the sacrificial patterns 310 disposed inwardly the gate spacer 136 may be exposed.

Figure 27:
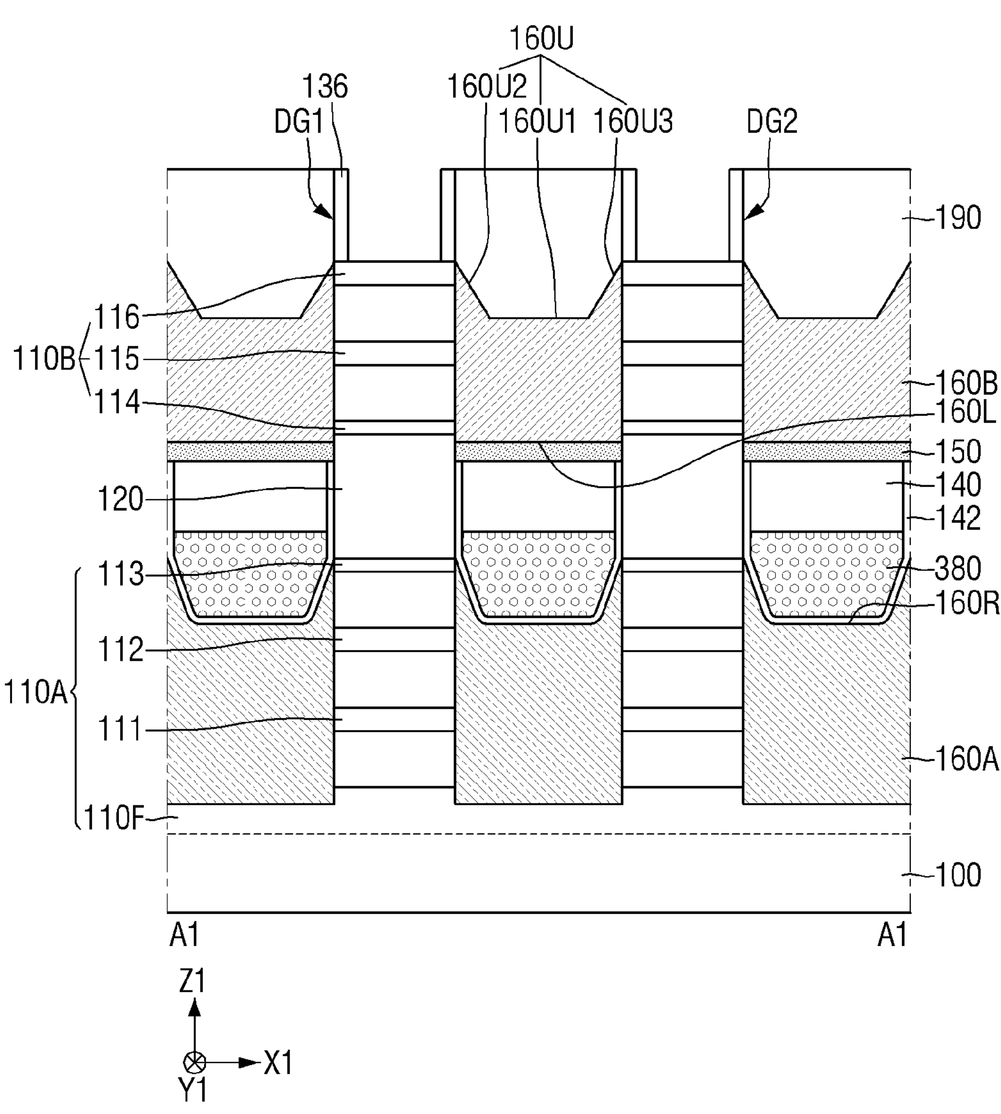

Referring to FIG. 27, the sacrificial patterns 310 are removed.

As described above, each of the sheet patterns 111 to 116 and each of the sacrificial patterns 310 may have different etching selectivity from each other. Accordingly, the sacrificial patterns 310 may be selectively removed. In an embodiment of the present disclosure, the sacrificial patterns 310 may be selectively removed by a wet etching process. However, the present disclosure is not limited thereto. As the sacrificial patterns 310 are removed, the sheet patterns 111 to 116 sequentially stacked on the substrate 100 and spaced apart from each other may be formed.

Figure 28:
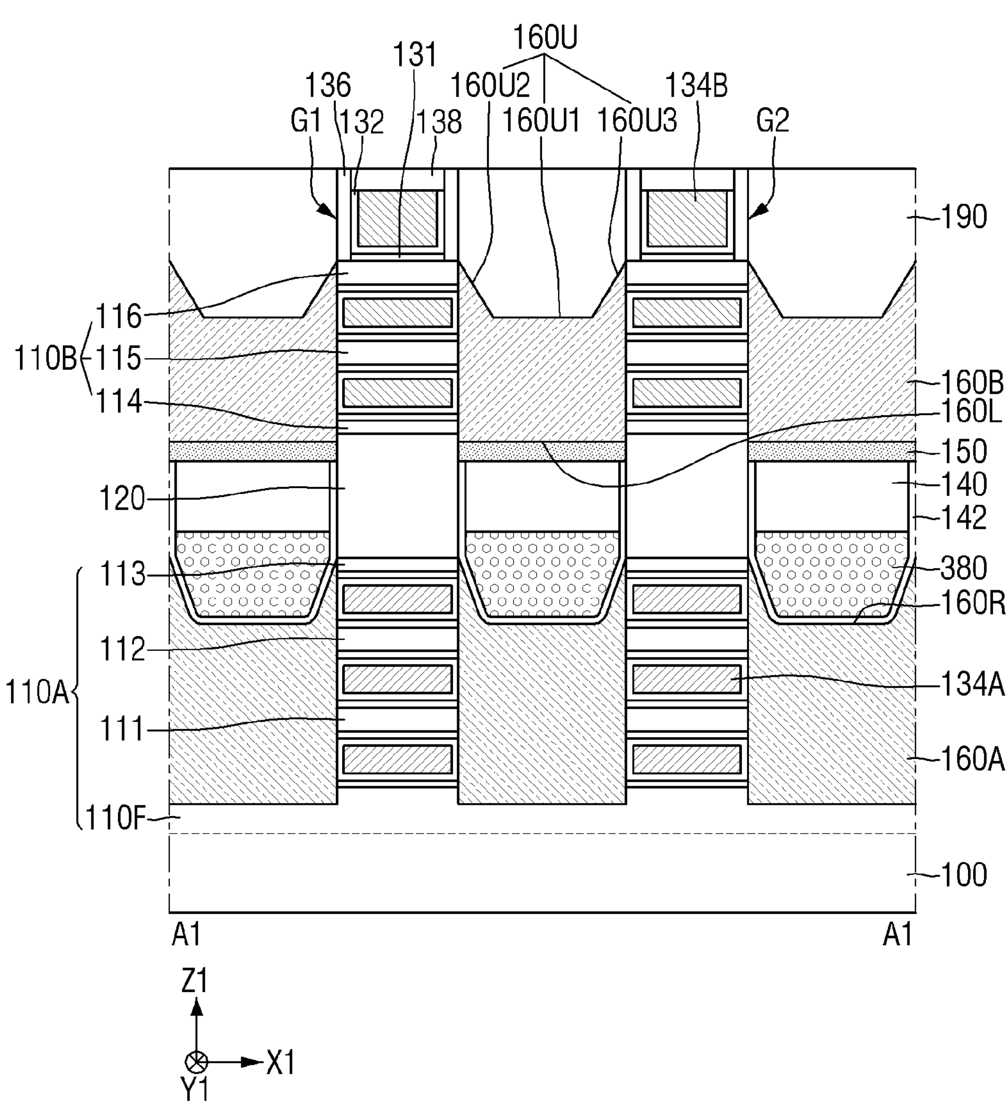

Referring to FIG. 28, the first and second gate structures G1 and G2 are formed.

The interfacial film 131 may be formed along an exposed surface of each of the sheet patterns 111 to 116. Subsequently, the gate dielectric film 132 conformally extending on the interfacial film 131 may be formed. Subsequently, the lower and upper gate electrodes 134A and 134B may be formed on the gate dielectric film 132. In an embodiment of the present disclosure, a top surface of the upper gate electrode 134B may be recessed. The gate capping pattern 138 may extend along the recessed top surface of the upper gate electrode. Accordingly, each of the first and second gate structures G1 and G2 including the interfacial film 131, the gate dielectric film 132, the gate electrodes 134A and 134B, the gate spacer 136, and the gate capping pattern 138 may be formed.

Figure 29:
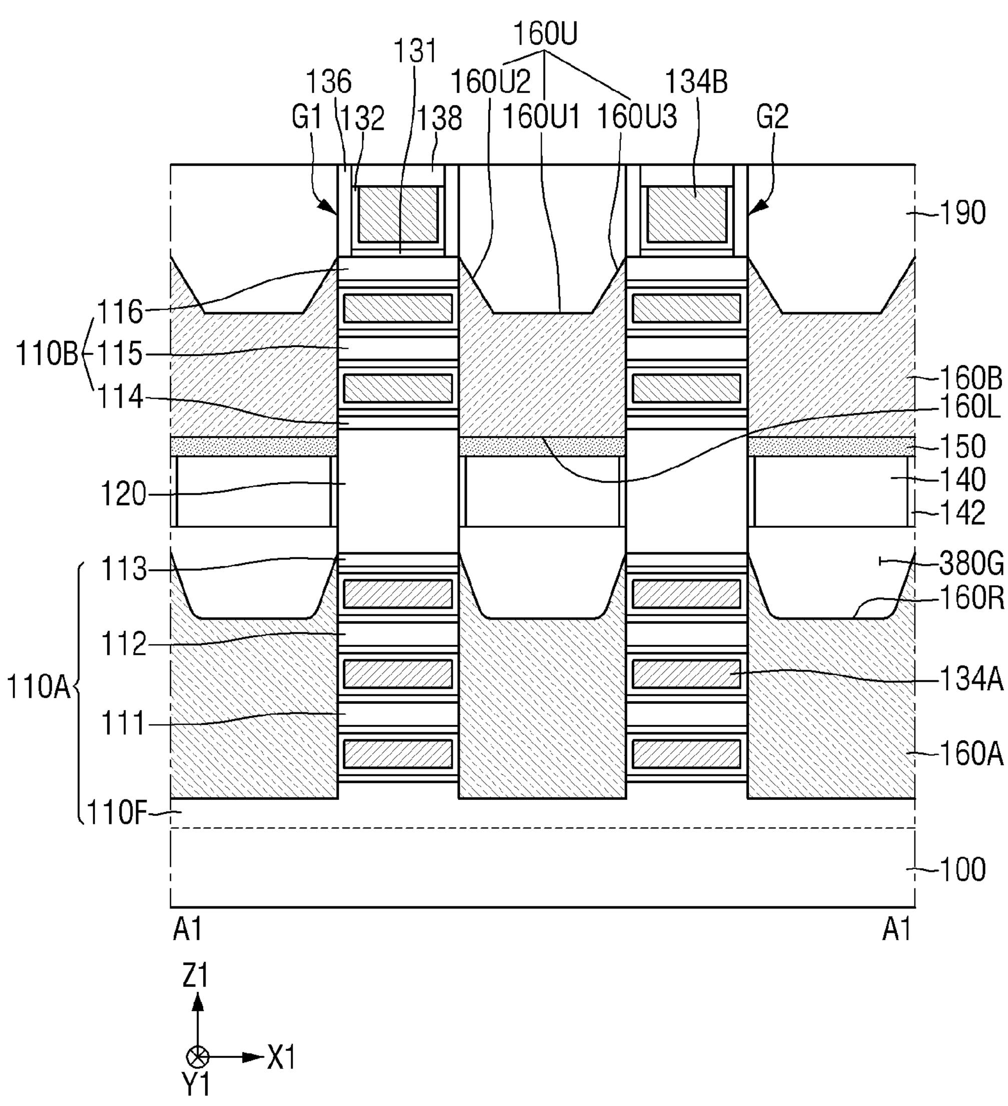

Referring to FIG. 29, the first epitaxial pattern 160A is exposed.

The sacrificial contact pattern 380 may be removed. Further, as the sacrificial contact pattern 380 is removed, an exposed at least a portion of the liner film 142 may be removed. For example, the portion of the liner film 142 surrounding the sacrificial contact pattern 380 may be removed. Thus, a gap 380G exposing the top surface of the first epitaxial pattern 160A may be formed between the first epitaxial pattern 160A and the insulating pattern 140.

Figure 30:
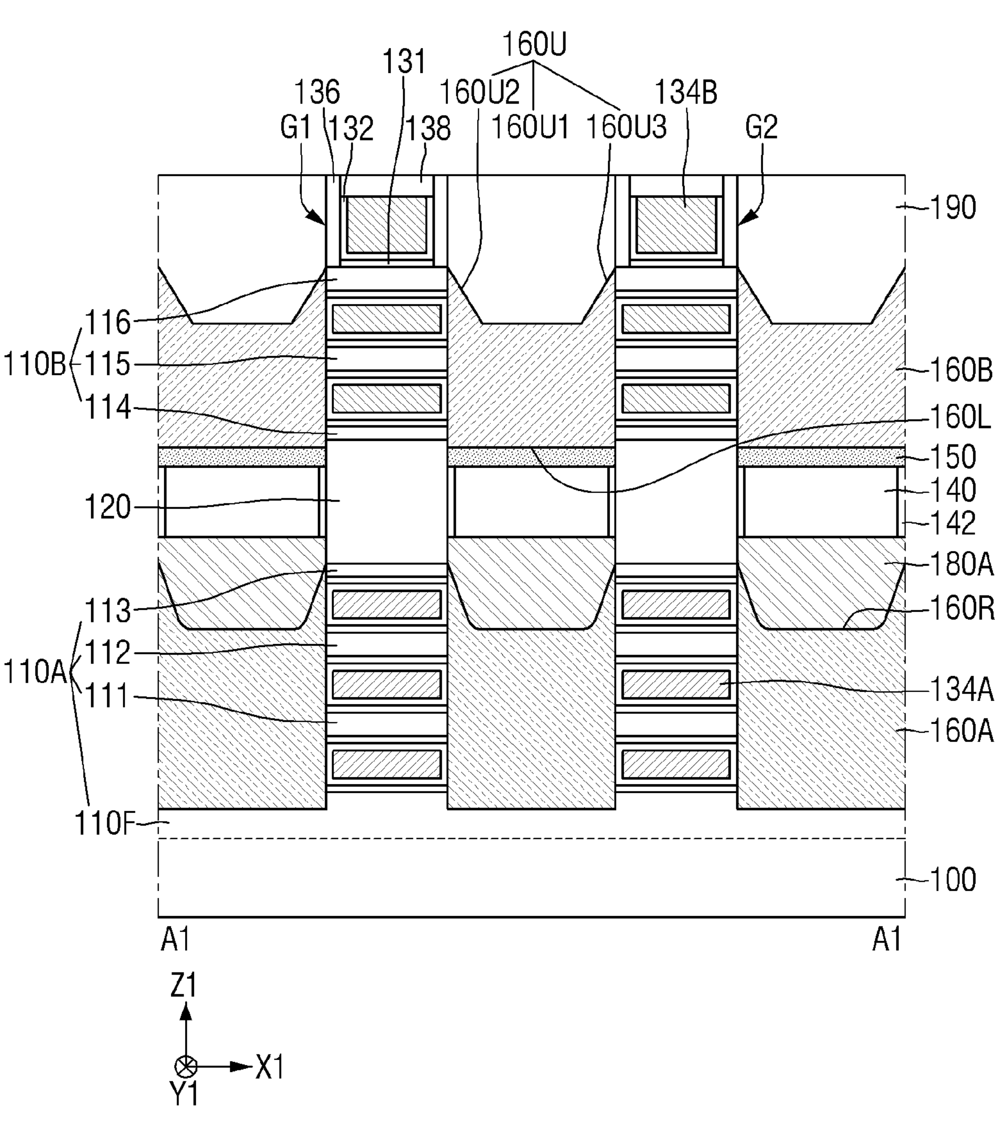

Referring to FIG. 30, the first source/drain contact 180A is formed.

The first source/drain contact 180A may be formed to fill the gap 380G in a resulting structure of FIG. 29. Thus, the first source/drain contact 180A electrically connected to the first epitaxial pattern 160A may be formed.

Subsequently, referring to FIG. 2, the second source/drain contact 180B is formed.

The second source/drain contact 180B may pass through the interlayer insulating film 190 so as to be electrically connected to the second epitaxial pattern 160B. Thus, the semiconductor device as described above with reference to FIG. 1 to FIG. 3 may be manufactured.

Figure 31:
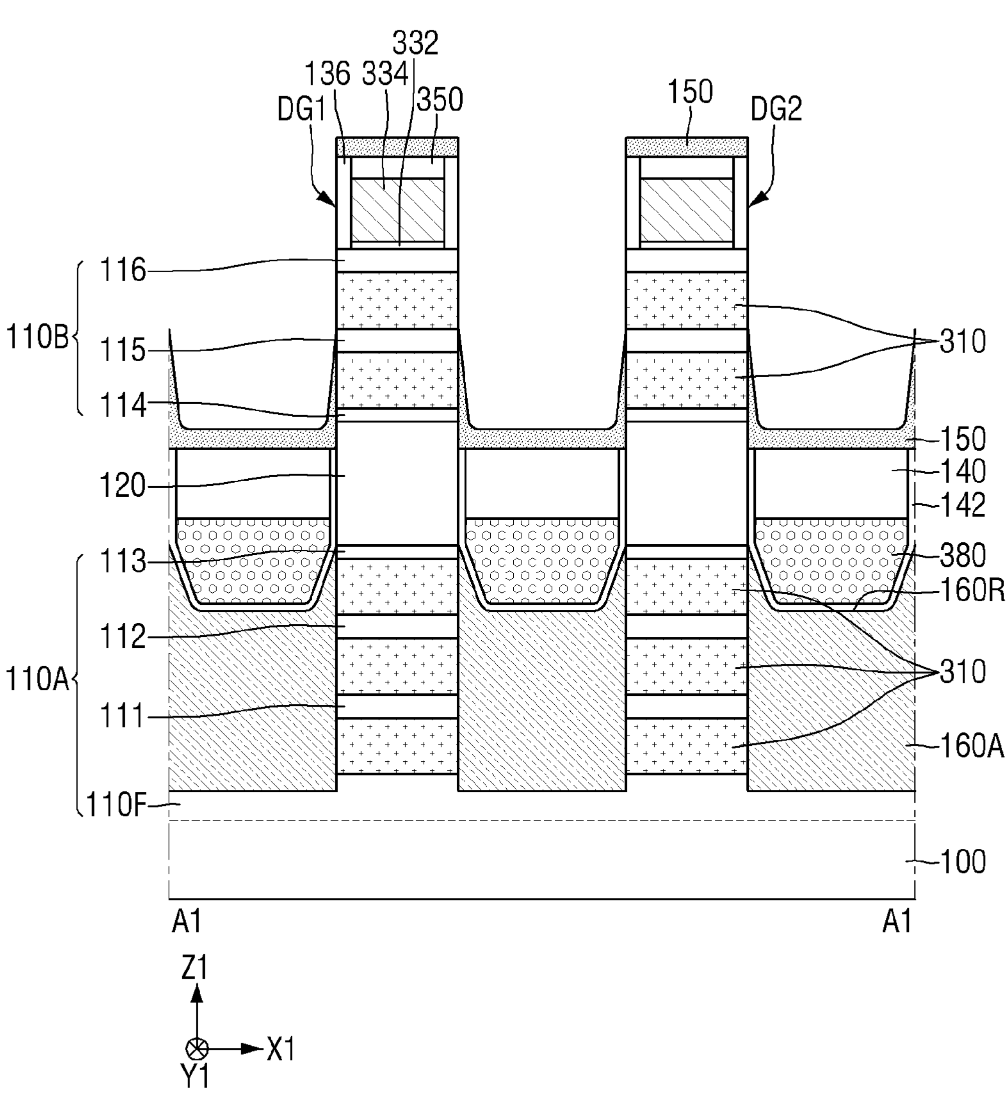
FIG. 31 is a diagram of an intermediate structure corresponding to an intermediate step for illustrating a method for manufacturing a semiconductor device according to an embodiment of the present disclosure.

FIG. 31 is a diagram of an intermediate structure corresponding to an intermediate step for illustrating a method for manufacturing a semiconductor device according to an embodiment of the present disclosure. For the convenience of description, those duplicate with the descriptions as set forth above with reference to FIG. 1 to FIG. 30 are briefly described or omitted. For reference, FIG. 31 is a diagram of an intermediate structure corresponding to an intermediate step to illustrate a step after FIG. 20. For example, FIG. 31 is a diagram of an intermediate structure with the semiconductor film being deposited similar to FIG. 21.

Referring to FIG. 31, the semiconductor film 150 is formed.

As shown, a portion of the semiconductor film 150 may further extend along a side surface of the second active pattern 110B and/or a side surface of each of the dummy gate structures DG1 and DG2. For example, the semiconductor film 150 may extend along the top surface of the insulating pattern 140, the top surface of the liner film 142, a portion of the side surface of the isolation pattern 120, a portion of the side surface of the second active pattern 110B, and a portion of the side surface of each of the dummy gate structures DG1 and DG2.

In an embodiment of the present disclosure, the semiconductor film 150 may be formed by a directional deposition process. In an embodiment of the present disclosure, the semiconductor film 150 may include a polycrystalline semiconductor material. For example, the semiconductor film 150 may include a polysilicon (p-Si) film. Depending on the characteristics of the directional deposition process, a portion of the semiconductor film 150 may be formed on at least a portion of a side surface as well as a top surface of a resulting structure of FIG. 20.

Subsequently, the steps as described above with reference to FIG. 22 to FIG. 30, FIG. 2 may be performed. Thus, the semiconductor device as described above with reference to FIG. 7 may be manufactured.

Figure 32:
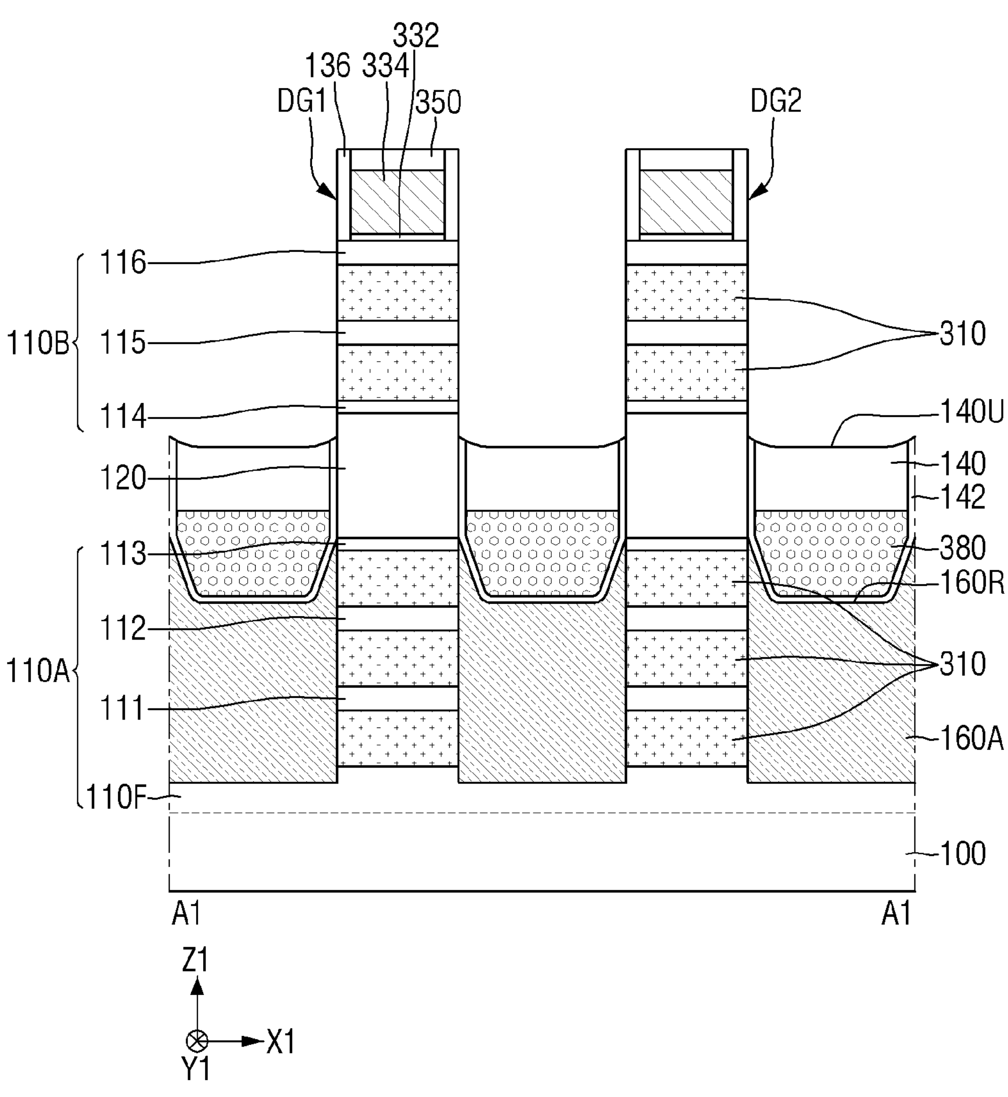
FIG. 32 is a diagram of an intermediate structure corresponding to an intermediate step for illustrating a method for manufacturing a semiconductor device according to an embodiment of the present disclosure.

FIG. 32 is a diagram of an intermediate structure corresponding to an intermediate step for illustrating a method for manufacturing a semiconductor device according to an embodiment of the present disclosure. For the convenience of description, those duplicate with the descriptions as set forth above with reference to FIG. 1 to FIG. 30 are briefly described or omitted. For reference, FIG. 32 is a diagram of an intermediate structure corresponding to an intermediate step to illustrate a step after FIG. 19. For example, FIG. 32 is a diagram of an intermediate structure with the liner film 142 and the insulating pattern 140 being recessed similar to FIG. 20.

Referring to FIG. 32, a third recess process on the liner film 142 and the insulating pattern 140 is performed.

As shown, as the third recess process is performed, the top surface of the insulating pattern 140 may include the concavely-curved surface 140U.

Subsequently, the steps as described above with reference to FIG. 21 to FIG. 30, FIG. 2 may be performed. For example, similar to the process step of FIG. 21, the semiconductor film 150 may be formed by a directional deposition process. The semiconductor film 150 may conformally extend along the concavely-curved surface 140U of the insulating pattern 140. Thus, the semiconductor device described above with reference to FIG. 8 may be manufactured.

Although the embodiments of the present disclosure have been described above with reference to the accompanying drawings, the present disclosure may not be limited to the embodiments and may be implemented in various different forms. Those of ordinary skill in the art will be able to appreciate that the present disclosure may be implemented in other specific forms without departing from the spirit and scope of the present disclosure as defined in the appended claims. Therefore, it should be understood that the embodiments of the present disclosure as described above are not restrictive but illustrative in all respects.

What is claimed is:

1. A semiconductor device comprising:

a substrate;

a first active pattern disposed on the substrate and extending in a first direction;

a second active pattern stacked on the first active pattern and extending in the first direction;

a first gate structure extending in a second direction to intersect the first active pattern and the second active pattern, the second direction intersecting the first direction;

a second gate structure spaced apart from the first gate structure in the first direction and extending in the second direction to intersect the first active pattern and the second active pattern;

a first epitaxial pattern interposed between the first gate structure and the second gate structure, the first epitaxial pattern connected to the first active pattern;

a second epitaxial pattern interposed between the first gate structure and the second gate structure, the second epitaxial pattern connected to the second active pattern;

an insulating pattern interposed between the first epitaxial pattern and the second epitaxial pattern; and a semiconductor film interposed between the insulating pattern and the second epitaxial pattern, the semiconductor film extending along a top surface of the insulating pattern, wherein a top surface of the first epitaxial pattern has a contact recess recessed toward the substrate.

2. The semiconductor device of claim 1, wherein the semiconductor film includes a polysilicon film.

3. The semiconductor device of claim 1, wherein a spacing between the first gate structure and the second gate structure is equal to or larger than about 15 nm.

4. The semiconductor device of claim 1, wherein the second epitaxial pattern includes a polycrystalline film.

5. The semiconductor device of claim 1, wherein a top surface of the second epitaxial pattern includes:

a flat surface parallel to a top surface of the substrate;

a first inclined surface disposed between the first gate structure and the flat surface; and a second inclined surface disposed between the second gate structure and the flat surface, wherein an angle defined between each of the first inclined surface and the second inclined surface and the flat surface is an obtuse angle.

6. The semiconductor device of claim 5, wherein a bottom surface of the second epitaxial pattern is parallel to the top surface of the substrate.

7. The semiconductor device of claim 1, wherein the second epitaxial pattern includes an epitaxial layer grown using the second active pattern and the semiconductor film as seed layers.

8. The semiconductor device of claim 1, further comprising an isolation pattern interposed between the first active pattern and the second active pattern, wherein the insulating pattern is disposed on a side surface of the isolation pattern.

9. The semiconductor device of claim 8, further comprising a liner film interposed between the isolation pattern and the insulating pattern, wherein the semiconductor film extends along the top surface of the insulating pattern and a top surface of the liner film.

10. The semiconductor device of claim 1, wherein the first active pattern includes a plurality of lower sheet patterns sequentially stacked on the substrate and spaced apart from each other, each of the plurality of lower sheet patterns extending in the first direction, and wherein the second active pattern includes a plurality of upper sheet patterns sequentially stacked on the first active pattern and spaced apart from each other, each of the plurality of upper sheet patterns extending in the first direction.

11. A semiconductor device comprising:

a substrate;

a first active pattern disposed on the substrate and extending in a first direction;

a second active pattern stacked on the first active pattern and extending in the first direction;

a gate structure disposed on the substrate and extending in a second direction intersecting the first direction, each of the first active pattern and the second active pattern passing through the gate structure;

a first epitaxial pattern disposed on a side surface of the gate structure, and connected to the first active pattern;

a second epitaxial pattern disposed on the side surface of the gate structure and connected to the second active pattern;

an insulating pattern interposed between the first epitaxial pattern and the second epitaxial pattern; and a semiconductor film interposed between the insulating pattern and the second epitaxial pattern, wherein the second epitaxial pattern includes an epitaxial layer grown using the second active pattern and the semiconductor film as seed layers, and wherein a top surface of the first epitaxial pattern has a contact recess recessed toward the substrate.

12. The semiconductor device of claim 11, wherein the semiconductor film includes a polycrystalline semiconductor material.

13. The semiconductor device of claim 12, wherein a lower portion of the second epitaxial pattern adjacent to the semiconductor film is polycrystalline.

14. The semiconductor device of claim 11, wherein the semiconductor film is formed using a directional deposition process.

15. The semiconductor device of claim 11, wherein the first epitaxial pattern includes an epitaxial layer grown using the substrate and the first active pattern as seed layers.

16. A semiconductor device comprising:

a substrate;

a plurality of lower sheet patterns sequentially stacked on the substrate, and spaced apart from each other, wherein each of the plurality of lower sheet patterns extends in a first direction;

a plurality of upper sheet patterns sequentially stacked on the plurality of lower sheet patterns, and spaced apart from each other, wherein each of the plurality of upper sheet patterns extends in the first direction;

an isolation pattern interposed between the plurality of lower sheet patterns and the plurality of upper sheet patterns;

a gate structure disposed on the substrate and extending in a second direction intersecting the first direction, wherein each of the plurality of lower sheet patterns and each of the plurality of upper sheet patterns pass through the gate structure;

a first epitaxial pattern disposed on a side surface of the gate structure, and connected to the plurality of lower sheet patterns, wherein the first epitaxial pattern has a first conductivity type;

a second epitaxial pattern disposed on the side surface of the gate structure, and connected to the plurality of upper sheet patterns, wherein the second epitaxial pattern has a second conductivity type different from the first conductivity type;

an insulating pattern disposed on a side surface of the isolation pattern and interposed between the first epitaxial pattern and the second epitaxial pattern; and a polysilicon film disposed between the insulating pattern and the second epitaxial pattern and extending along a top surface of the insulating pattern, wherein a top surface of the first epitaxial pattern has a contact recess recessed toward the substrate.

17. The semiconductor device of claim 16, further comprising a liner film interposed between the isolation pattern and the insulating pattern, wherein the polysilicon film extends along the top surface of the insulating pattern and a top surface of the liner film.

18. The semiconductor device of claim 17, wherein the insulating pattern includes silicon oxide, and wherein the liner film includes silicon nitride.

19. The semiconductor device of claim 16, further comprising a lower source/drain contact disposed between the first epitaxial pattern and the insulating pattern and electrically connected to the first epitaxial pattern.

20. The semiconductor device of claim 16, further comprising an upper source/drain contact disposed on the second epitaxial pattern and electrically connected to the second epitaxial pattern.

* * * * *